(12) United States Patent
Lim et al.

(10) Patent No.: US 11,444,145 B2
(45) Date of Patent: Sep. 13, 2022

(54) DISPLAY DEVICE

(71) Applicant: Samsung Display Co., Ltd., Yongin-si (KR)

(72) Inventors: Hyung Chul Lim, Cheonan-si (KR); Won Ho Kim, Seongnam-si (KR); Jeong Ho Lee, Asan-si (KR); Yang Hee Kim, Yongin-si (KR); SoYeon Park, Seoul (KR); Sung Woo Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 155 days.

(21) Appl. No.: 17/066,019

(22) Filed: Oct. 8, 2020

(65) Prior Publication Data

US 2021/0257436 A1 Aug. 19, 2021

(30) Foreign Application Priority Data

Feb. 14, 2020 (KR) .................. 10-2020-0018581

(51) Int. Cl.
*H01L 27/32* (2006.01)

(52) U.S. Cl.
CPC ........ *H01L 27/3276* (2013.01); *H01L 27/323* (2013.01); *H01L 27/3246* (2013.01)

(58) Field of Classification Search
CPC ............... H01L 27/3276; H01L 27/323; H01L 27/3246; H01L 27/3248; H01L 27/3262; H01L 27/3279; H01L 27/3258; H01L 51/5203

See application file for complete search history.

(56) References Cited

U.S. PATENT DOCUMENTS

2010/0079717 A1*  4/2010  Park ..................... G09G 3/20
                                              349/152

FOREIGN PATENT DOCUMENTS

KR          10-0567225 B1       4/2006

* cited by examiner

*Primary Examiner* — Kyoung Lee
(74) *Attorney, Agent, or Firm* — Lewis Roca Rothgerber Christie LLP

(57) ABSTRACT

A display device includes a substrate, a pixel structure, a lighting circuit part, a driving integrated circuit part, a first lighting wire, a second lighting wire, and a connection electrode. The substrate includes a display area and a pad area. The pixel structure is on the substrate in the display area to emit light. The lighting circuit part is on the substrate in the pad area, and is electrically coupled to the pixel structure. The first lighting wire is spaced apart from a first side of the driving integrated circuit part in a first direction, and is coupled to the lighting circuit part. The second lighting wire is spaced apart from a second side facing the first side of the driving integrated circuit part in a second direction opposite to the first direction. The connection electrode electrically couples the first lighting wire and the second lighting wire to each other.

20 Claims, 23 Drawing Sheets

DISPLAY DEVICE

CROSS-REFERENCE TO RELATED APPLICATION

This application claims priority to and the benefit of Korean Patent Application No. 10-2020-0018581 filed on Feb. 14, 2020, in the Korean Intellectual Property Office (KIPO), the entire content of which is hereby incorporated by reference.

BACKGROUND

1. Field

Exemplary embodiments of the present disclosure relate generally to a display device. For example, embodiments of the present disclosure relate to a display device including a lighting circuit part.

2. Description of the Related Art

Flat panel display devices are used as display devices for replacing a cathode ray tube display device due to light-weight and thin characteristics thereof. As non-limiting representative examples of such flat panel display devices, there are a liquid crystal display device and an organic light emitting diode display device.

In a manufacturing process of a display device, a lighting inspection may be performed to inspect a pixel structure included in the display device. In this case, when the display device is an organic light emitting diode display device, the pixel structure may include an anode electrode, an organic light emitting layer on the anode electrode, a cathode electrode on the organic light emitting layer, and/or the like. In addition, in order to perform the lighting inspection, a lighting circuit part, lighting wires electrically coupled to the lighting circuit part to transmit lighting inspection signals, and a connection electrode configured to couple the lighting wires to each other may be provided in the display device. However, in a process of forming the anode electrode by forming a preliminary electrode layer and partially etching the preliminary electrode layer, an etchant used in the etching process may etch a portion of the connection electrode. In other words, an undercut may be generated in the connection electrode due to the etchant. When an insulating layer is on the partially etched connection electrode, the insulating layer may be cut on a side surface of the connection electrode due to the undercut. In this case, the connection electrode may be exposed to an outside, and the connection electrode exposed to the outside may be corroded. Accordingly, the lighting inspection may not be accurately performed.

SUMMARY

Some exemplary embodiments provide a display device including a lighting circuit part.

According to some exemplary embodiments, a display device includes a substrate, a pixel structure, a lighting circuit part, a driving integrated circuit part, a first lighting wire, a second lighting wire, and a connection electrode. The substrate includes a display area and a pad area. The pixel structure is on the substrate in the display area to emit light. The lighting circuit part is on the substrate in the pad area, and is electrically coupled to the pixel structure. The driving integrated circuit part surrounds at least a portion of the lighting circuit part. The first lighting wire is spaced apart from a first side of the driving integrated circuit part in a first direction, and is coupled to the lighting circuit part. The second lighting wire is spaced apart from a second side facing the first side of the driving integrated circuit part in a second direction opposite to the first direction. The connection electrode electrically couples the first lighting wire and the second lighting wire to each other.

In exemplary embodiments, each of the first lighting wire and the second lighting wire may not overlap the driving integrated circuit part.

In exemplary embodiments, the driving integrated circuit part may have a rectangular shape having an opening when viewed in a plan view, and the lighting circuit part may be in the opening.

In exemplary embodiments, the driving integrated circuit part and the lighting circuit part may be spaced apart from each other.

In exemplary embodiments, the substrate may further include a first circuit area, a second circuit area, and a lighting wire area. The driving integrated circuit part having an opening may be in the first circuit area. The lighting circuit part located inside the opening of the driving integrated circuit part may be in the second circuit area. The lighting wire area may be interposed between the first circuit area and the second circuit area, and the first lighting wire may be in the lighting wire area.

In exemplary embodiments, the connection electrode may be located between the substrate and the driving integrated circuit part in the first circuit area.

In exemplary embodiments, the display device may further include a sensing structure on the pixel structure.

In exemplary embodiments, the sensing structure may include a sensing electrode, a first insulating layer on the sensing electrode, and a sensing connection electrode on the first insulating layer.

In exemplary embodiments, the sensing electrode and the connection electrode may each include a same material.

In exemplary embodiments, the first insulating layer may extend in a direction from the display area to the pad area to cover the sensing electrode in the display area, and may cover the connection electrode in the pad area.

In exemplary embodiments, the first insulating layer may directly contact a bottom surface of the driving integrated circuit part and a top surface of the connection electrode in the pad area.

In exemplary embodiments, the display device may further include a semiconductor element in the display area between the substrate and the pixel structure.

In exemplary embodiments, the semiconductor element may include an active layer on the substrate, a gate electrode on the active layer, and source and drain electrodes on the gate electrode.

In exemplary embodiments, the first lighting wire and the second lighting wire may be located on a same layer as the source and drain electrodes, and the first lighting wire and the second lighting wire may include a same material.

In exemplary embodiments, the connection electrode may be located on a same layer as the gate electrode, and may include a same material as the gate electrode.

In exemplary embodiments, the display device may further include a first planarization layer between the substrate and the pixel structure and a second planarization layer on the first planarization layer.

In exemplary embodiments, the first planarization layer may have a first opening formed in a portion of the pad area. The second planarization layer may have a second opening overlapping the first opening. The driving integrated circuit part may be inside the first and second openings.

In exemplary embodiments, a first contact hole may pass through the first planarization layer and the second planarization layer and expose a portion of the first lighting wire and a second contact hole may pass through the first planarization layer and the second planarization layer and expose a portion of the second lighting wire in the pad area. The connection electrode may be coupled to the first lighting wire and the second lighting wire through the first contact hole and the second contact hole, respectively.

In exemplary embodiments, the display device may further include an insulating pattern surrounding at least a portion of the connection electrode.

In exemplary embodiments, the insulating pattern may include a same material as the second planarization layer.

Because the display device according to exemplary embodiments of the present disclosure includes the first and second connection electrodes which are formed concurrently (e.g., simultaneously) with the first and second sensing electrodes in the same process, the first and second connection electrodes are formed after the lower electrode 290 is formed, so that the etchant used to form the lower electrode may not make contact (e.g., physical contact) with the first and second connection electrodes. For example, in some embodiments, the undercut phenomenon may not occur due to the etchant in the first and second connection electrodes, and the first insulating layer may completely cover the first and second connection electrodes such that the first and second connection electrodes are not exposed to the outside. Accordingly, the first and second connection electrodes are not exposed to the outside, so that the first and second connection electrodes may not be corroded, and the lighting inspection for the display device may be accurately performed.

In some embodiments, the display device includes the first and second connection electrodes which are formed concurrently (e.g., simultaneously) with the first gate electrode or the second gate electrode in the same process, the first interlayer insulating layer and the second interlayer insulating layer completely cover the first and second connection electrodes, so that the etchant used to form the lower electrode may not make contact (e.g., physical contact) with the first and second connection electrodes. For example, in some embodiments, the undercut phenomenon may not occur due to the etchant in the first and second connection electrodes, and the first interlayer insulating layer or the second interlayer insulating layer may completely cover the first and second connection electrodes such that the first and second connection electrodes are not exposed to the outside. Accordingly, the first and second connection electrodes are not exposed to the outside, so that the first and second connection electrodes may not be corroded.

Further, the display device includes the first insulating pattern and the second insulating pattern, so that the etchant used to form the lower electrode may not make contact (e.g., physical contact) with the both sides of each of the first and second connection electrodes in the process of forming the lower electrode. For example, because the both sides of each of the first and second connection electrodes may be etched to the relatively greater extent by the etchant, which causes the undercut phenomenon, the both sides of each of the first and second connection electrodes may be covered with the first and second insulating patterns, so that the undercut phenomenon may be prevented or reduced.

BRIEF DESCRIPTION OF THE DRAWINGS

Exemplary embodiments can be understood in more detail from the following description taken in conjunction with the accompanying drawings, in which.

DETAILED DESCRIPTION

Figure 1:
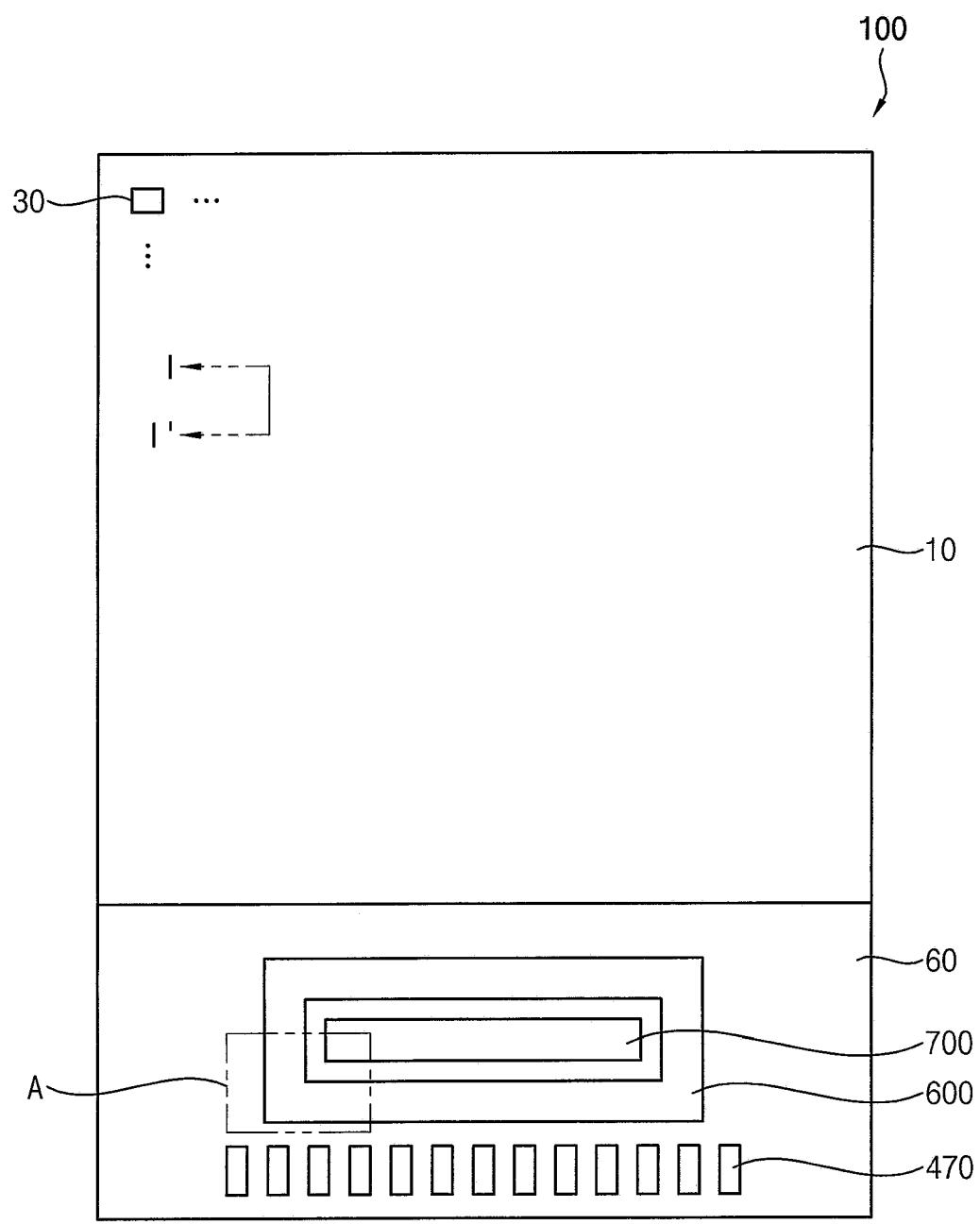
FIG. 1 is a plan view showing a display device according to exemplary embodiments of the present disclosure.

Hereinafter, display devices and a method of manufacturing a display device according to exemplary embodiments of the present disclosure will be described in more detail with reference to the accompanying drawings. In the accompanying drawings, same or similar reference numerals refer to the same or similar elements.

Figure 2:
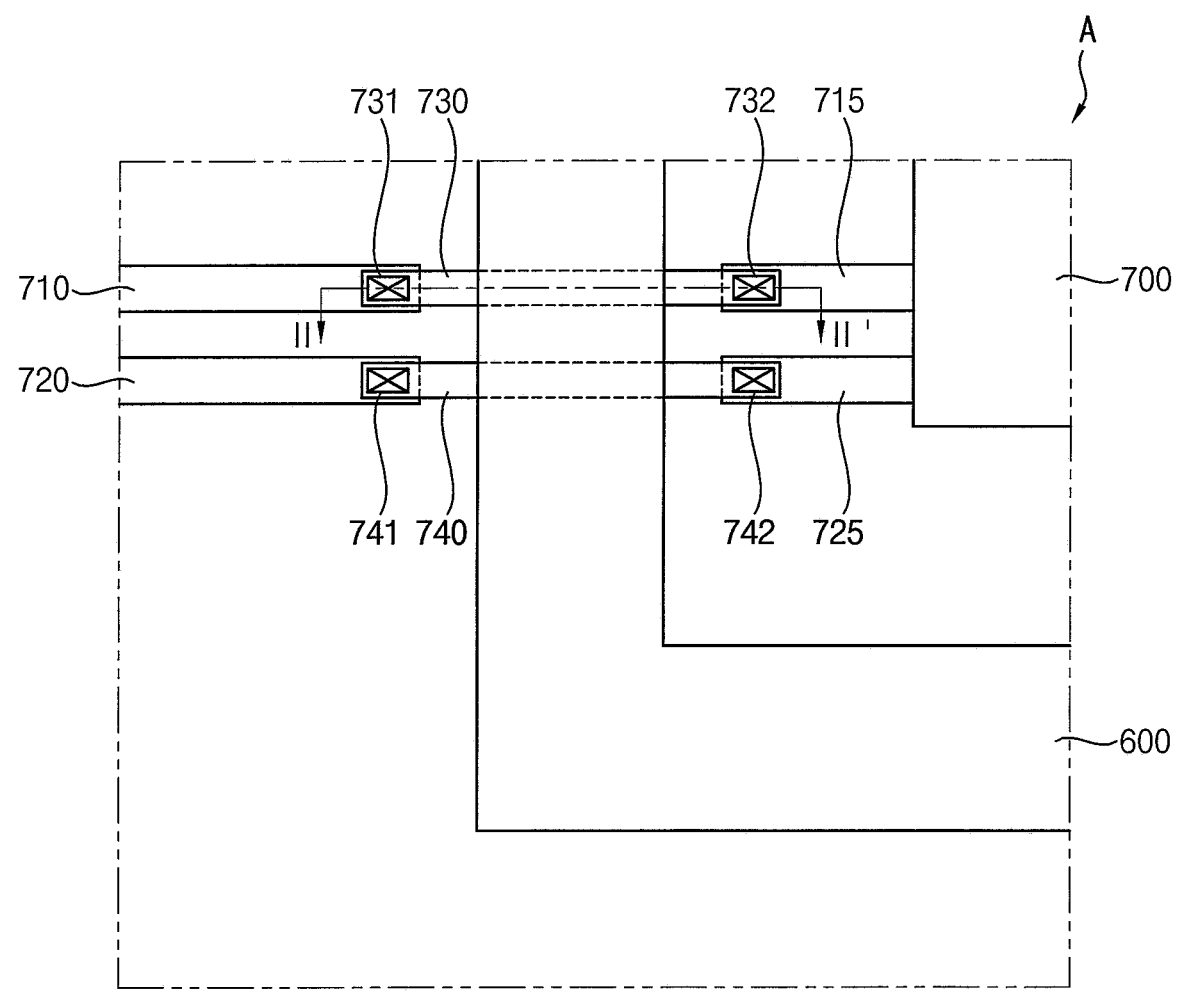
FIG. 2 is a partially enlarged plan view showing CA' region of FIG. 1.
Figure 2:
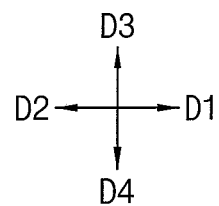
Figure 3:
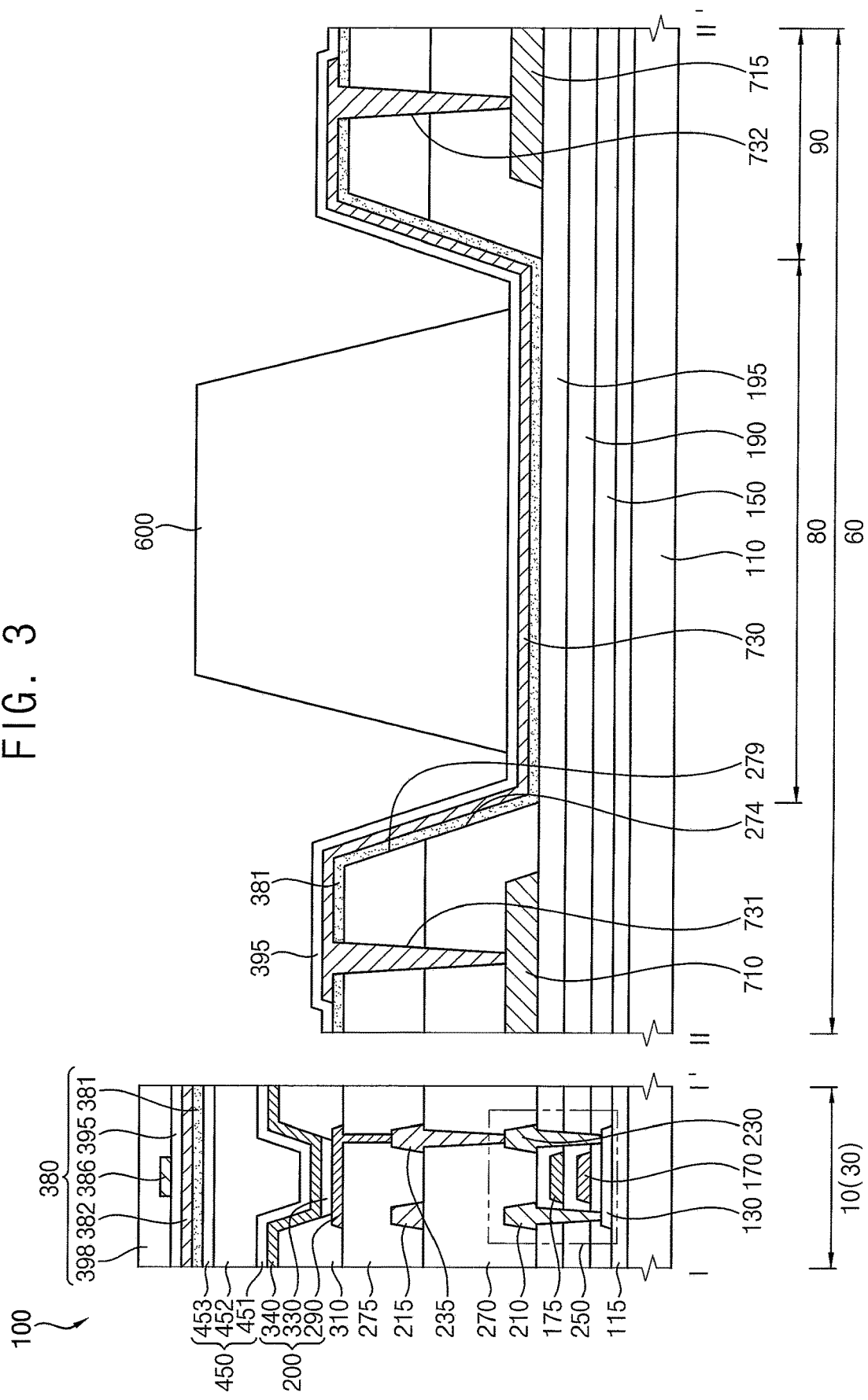
FIG. 3 is a cross-sectional view taken along line I-I' of FIG. 1 and line II-II' of FIG. 2.
Figure 4:
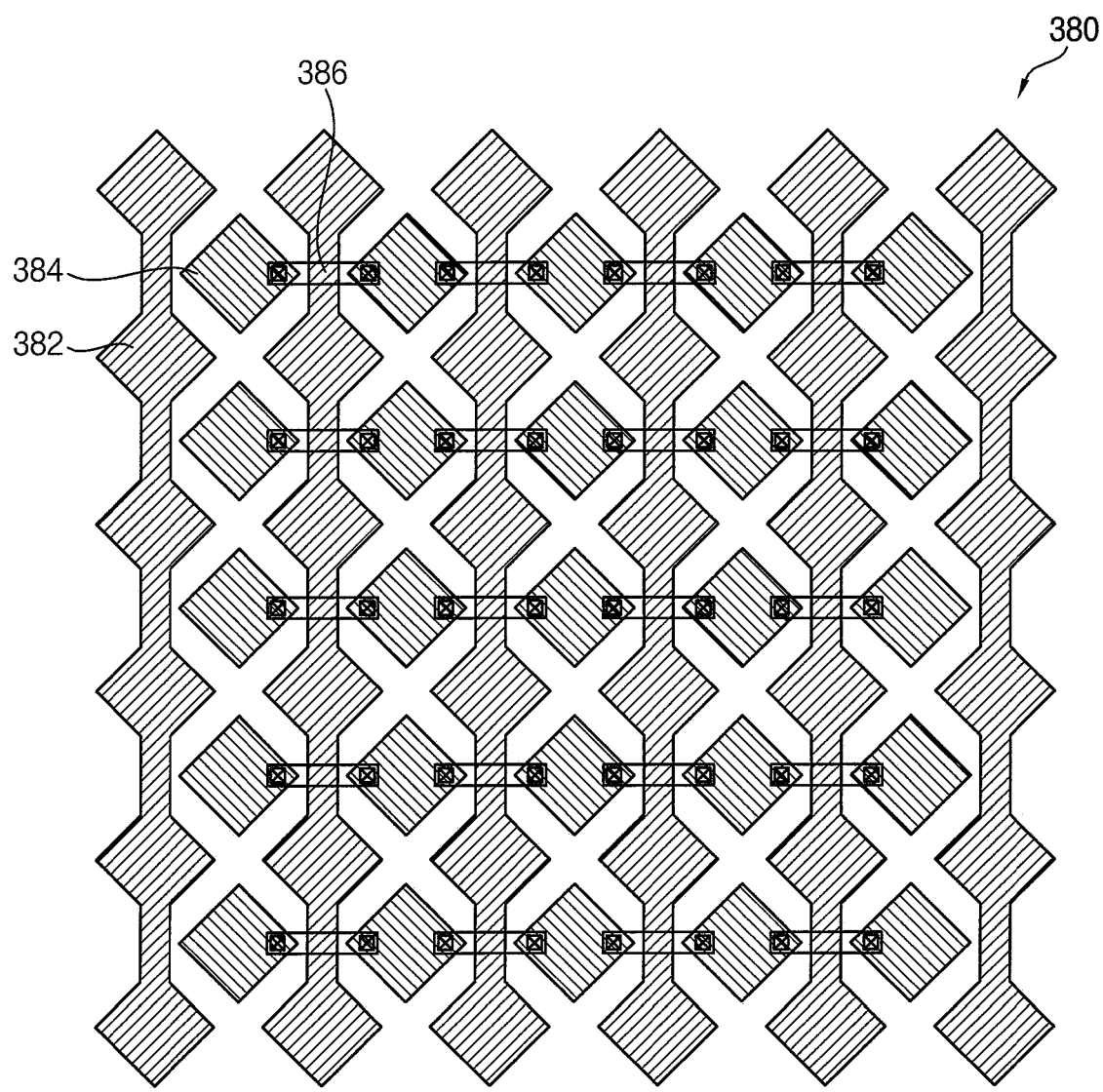
FIG. 4 is a plan view for describing a sensing structure included in the display device of FIG. 3.

FIG. 1 is a plan view showing a display device according to exemplary embodiments of the present disclosure, FIG. 2 is a partially enlarged plan view showing 'A' region of FIG. 1, FIG. 3 is a cross-sectional view taken along line I-I' of FIG. 1 and line II-II' of FIG. 2, and FIG. 4 is a plan view illustrating a sensing structure included in the display device of FIG. 3.

Referring to FIGS. 1, 2, 3, and 4, a display device 100 may include a substrate 110, a buffer layer 115, a semiconductor element 250, a first lighting wire 715, a second lighting wire 710, a third lighting wire 725, a fourth lighting wire 720, a first planarization layer 270, a wire pattern 215, a connection pattern 235, a second planarization layer 275, a first connection electrode 730, a second connection electrode 740, a pixel structure 200, a pixel defining layer 310, a thin film encapsulation structure 450, a sensing structure 380, a driving integrated circuit part 600, a lighting circuit part 700, pad electrodes 470, and/or the like.

Figure 12:
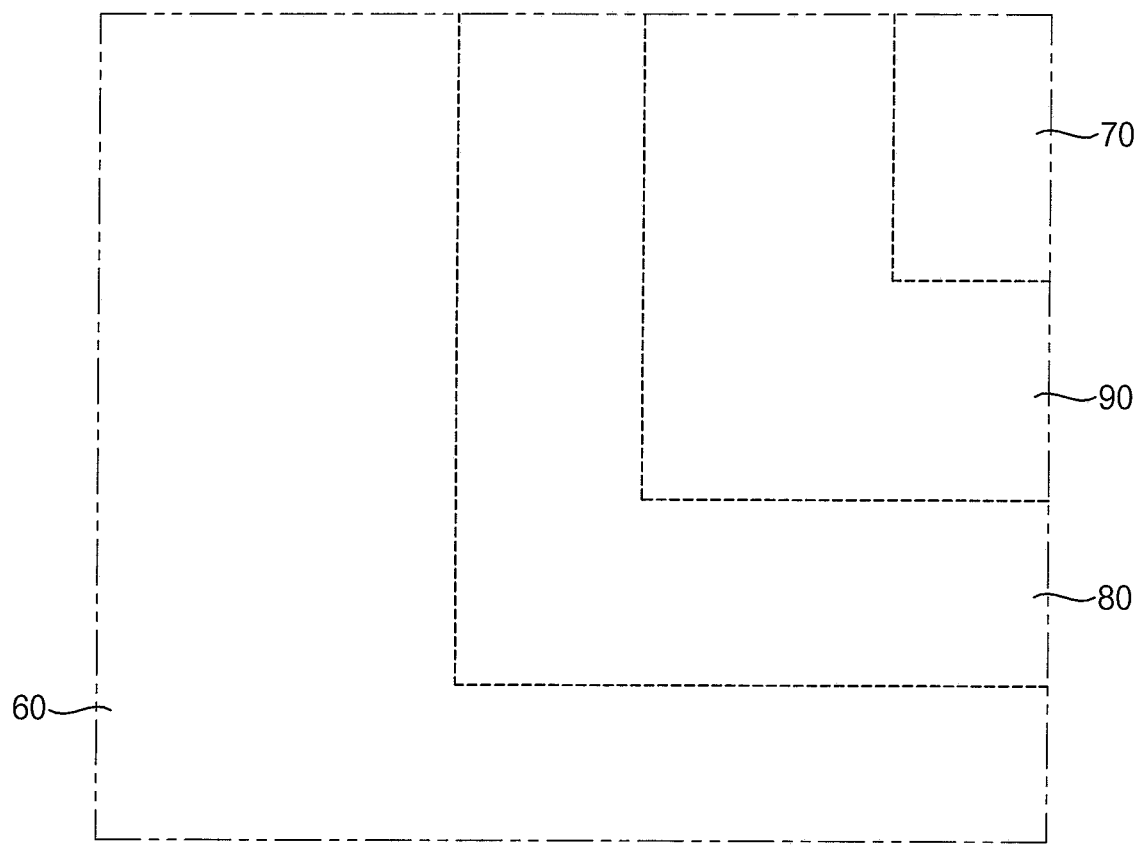
Figure 12:
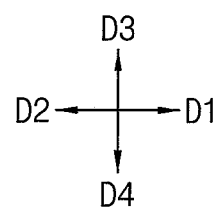

In some embodiments, the semiconductor element 250 may include an active layer 130, a gate insulating layer 150, a first gate electrode 170, a first interlayer insulating layer 190, a second gate electrode 175, a second interlayer insulating layer 195, a source electrode 210, and a drain electrode 230, and the pixel structure 200 may include a lower electrode 290, an organic light emitting layer 330, and an upper electrode 340. In some embodiments, the thin film encapsulation structure 450 may include a first inorganic thin film encapsulation layer 451, an organic thin film encapsulation layer 452, and a second inorganic thin film encapsulation layer 453, and as shown in FIGS. 3 and 4, the sensing structure 380 may include an insulating layer 381, first sensing electrodes 382, second sensing electrodes 384, a first insulating layer 395, sensing connection electrodes 386, and a second insulating layer 398. The display device 100 may also include a display area 10 and a pad area 60. In some embodiments, the display area 10 may include a plurality of pixel areas 30, and as shown in FIGS. 1 and 12, the pad area 60 may include a first circuit area 80, a second circuit area 70, and a lighting wire area 90. In exemplary embodiments, the first circuit area 80 may surround at least a portion of the second circuit area 70. For example, the first circuit area 80 may substantially surround the second circuit area 70 and the lighting wire area 90, and the lighting wire area 90 may substantially surround the second circuit area 70. In exemplary embodiments, the first planarization layer 270 and the second planarization layer 275 may include a first contact hole 732, a second contact hole 731, a third contact hole 742, and a fourth contact hole 741. For example, as shown in FIGS. 2 and 3, the first contact hole 732 and the third contact hole 742 may be formed in the first planarization layer 270 and the second planarization layer 275 located in the lighting wire area 90, and the second contact hole 731 and the fourth contact hole 741 may be formed in the first planarization layer 270 and the second planarization layer 275 located in the pad area 60.

Referring again to FIGS. 1, 2, and 3, the pixel structure 200 may be in each of the pixel areas 30, and light may be emitted from the organic light emitting layer 330. An image may be displayed in the display area 10 by the pixel structure 200.

The pad electrodes 470 may be on one side of the pad area 60, and the pad electrodes 470 may be spaced apart from each other in a first direction D1 (or a second direction D2 opposite to the first direction D1) parallel (e.g., substantially parallel) to a top surface of the display device 100. In some embodiments, the pad electrodes 470 may be electrically coupled to an external device which generates a plurality of pixel signals (e.g., a gate signal, a data signal, an emission control signal, a gate initialization signal, a power supply voltage, etc.), and the pad electrodes 470 may be electrically coupled to the driving integrated circuit part 600. The driving integrated circuit part 600 may also be electrically coupled to the pixel structure 200, and the pixel signals (e.g., the data signal) may be provided to the pixel structure 200 through the pad electrodes 470 and the driving integrated circuit part 600.

The lighting circuit part 700 may be in the second circuit area 70. For example, the lighting circuit part 700 may be spaced apart from the pad electrodes 470 in a third direction D3 perpendicular (e.g., substantially perpendicular) to the first direction D1 and the second direction D2. The lighting circuit part 700 may include lighting semiconductor elements, and may be coupled to the first lighting wire 715 and the third lighting wire 725. For example, in some embodiments, some of the semiconductor elements may be directly coupled to the first lighting wire 715 and the third lighting wire 725. In some embodiments, the lighting circuit part 700 may be electrically coupled to the pixel structure 200.

The driving integrated circuit part 600 may be in the first circuit area 80. The driving integrated circuit part 600 may surround at least a portion of the lighting circuit part 700. In exemplary embodiments, the driving integrated circuit part 600 may substantially surround the lighting circuit part 700, and may be spaced apart from an outer periphery of the lighting circuit part 700. For example, in some embodiments, the lighting circuit part 700 may be in an opening defined by the driving integrated circuit part 600. In some embodiments, a separation space between the lighting circuit part 700 and the driving integrated circuit part 600 may be defined as the lighting wire area 90. For example, in some embodiments, the driving integrated circuit part 600 may have a rectangular shape having an opening, and the lighting circuit part 700 may be in the opening, but the present disclosure is not limited thereto. The driving integrated circuit part 600 may include driving semiconductor elements, driving capacitors, and/or the like, and may receive input signals (e.g., the data signal) and a driving power from the external device. The driving integrated circuit part 600 may provide an output signal to the pixel structure 200 based on the input signal. Accordingly, the driving integrated circuit part 600 may control driving of the display structure 200.

The first lighting wire 715 and the third lighting wire 725 may be in the lighting wire area 90. A first end of the first lighting wire 715 may be coupled to the lighting circuit part 700, and a second end opposite to the first end of the first lighting wire 715 may overlap the first contact hole 732. In some embodiments, a first end of the third lighting wire 725 may be coupled to the lighting circuit part 700, and a second end opposite to the first end of the third lighting wire 725 may overlap the third contact hole 742.

The second lighting wire 710 and the fourth lighting wire 720 may be in the pad area 60 adjacent to the first lighting wire 715 and the third lighting wire 725. A first end of the second lighting wire 710 may overlap the second contact hole 731, and a second end opposite to the first end of the second lighting wire 710 may be coupled to one of the pad electrodes 470. In some embodiments, a first end of the fourth lighting wire 720 may overlap the fourth contact hole 741, and a second end opposite to the first end of the fourth lighting wire 720 may be coupled to another one of the pad electrodes 470.

Each of the first connection electrode 730 and the second connection electrode 740 may be in a portion of the pad area 60, a portion of the first circuit area 80, and a portion of the lighting wire area 90. In exemplary embodiments, each of the first connection electrode 730 and the second connection electrode 740 may be under the driving integrated circuit part 600 to overlap a portion of the driving integrated circuit part 600. For example, a first end of the first connection electrode 730 may be coupled to the first lighting wire 715 through the first contact hole 732, and a second end opposite to the first end of the first connection electrode 730 may be coupled to the second lighting wire 710 through the second contact hole 731. In some embodiments, the first connection electrode 730 may couple the first lighting wire 715 to the second lighting wire 710. In some embodiments, a first end of the second connection electrode 740 may be coupled to the third lighting wire 725 through the third contact hole 742, and a second end opposite to the first end of the second connection electrode 740 may be coupled to the fourth lighting wire 720 through the fourth contact hole 741. For example, in some embodiments, the second connection electrode 740 may couple the third lighting wire 725 to the fourth lighting wire 720.

For example, a lighting gate signal applied to the gate electrode of the semiconductor element included in the lighting circuit part 700 may be provided to the second lighting wire 710. In some embodiments, a lighting emission voltage applied to the source electrode of the semiconductor element may be provided to the fourth lighting wire 720. In some embodiments, when the lighting gate signal is applied to the gate electrode through the second lighting wire 710, the first connection electrode 730, and the first lighting wire 715, the lighting emission voltage may be applied to the pixel structure 200 through the fourth lighting wire 720, the second connection electrode 740, the third lighting wire 725, and the source and drain electrodes of the semiconductor element, and the light may be emitted from the organic light emitting layer 330 of the pixel structure 200. Through such a process, a lighting inspection of the pixel structure 200 may be performed.

Although one lighting emission voltage and one lighting gate signal have been described as being provided to the lighting circuit part 700 according to embodiments the present disclosure, the configuration of embodiments of the present disclosure is not limited thereto. For example, the display device 100 may further include additional lighting wires coupled to the lighting circuit part 700, and lighting emission voltages having different voltage levels and additional lighting gate signals may be provided.

In some embodiments, although the first to fourth lighting wires 715, 710, 725, and 720 and the first and second connection electrodes 730 and 740 have been shown in FIG. 2 as being on a left side of the lighting circuit part 700 for convenience, the first to fourth lighting wires 715, 710, 725, and 720 and the first and second connection electrodes 730 and 740 may be symmetrically arranged on a right side of the lighting circuit part 700.

Referring again to FIG. 3, the substrate 110 including transparent or opaque materials may be provided. The substrate 110 may be a transparent resin substrate that is flexible. For example, the substrate 110 may have a configuration in which a first organic layer, a first barrier layer, a second organic layer, and a second barrier layer are sequentially stacked. The first barrier layer and the second barrier layer may include an inorganic material such as, for example, silicon oxide, and may block or reduce penetration of water and/or moisture through the first and second organic layers. In some embodiments, the first organic layer and the second organic layer may include an organic insulating material such as, for example, a polyimide-based resin, and may be flexible.

Because the substrate 110 is thin and flexible, the substrate 110 may be formed on a rigid glass substrate to support formation of the semiconductor element 250, the pixel structure 200, the thin film encapsulation structure 450, and/or the like. For example, after arranging the buffer layer 115 on the second barrier layer, an upper structure (e.g., the semiconductor element 250, the pixel structure 200, the thin film encapsulation structure 450, etc.) may be formed on the buffer layer 115. After the formation of the upper structure, the glass substrate may be removed. For example, in some embodiments, due to flexible physical properties of the substrate 110, it may be difficult to directly form the upper structure on the substrate 110. Taking this circumstance into consideration, the upper structure may be formed by using a rigid glass substrate, and then removing the glass substrate, so that the first organic layer, the first barrier layer, the second organic layer, and the second barrier layer may be used as the substrate 110.

The display device 100 includes the display area 10 including the pixel area 30, and the pad area 60 including the first circuit area 80, the lighting wire area 90, and the second circuit area 70, so that the substrate 110 may also be divided into the display area 10 including the pixel area 30, and the pad area 60 including the first circuit area 80, the second circuit area 70, and the lighting wire area 90.

In some embodiments, the substrate 110 may include a quartz substrate, a synthetic quartz substrate, a calcium fluoride substrate, a fluorine-doped quartz substrate (F-doped quartz substrate), a soda lime glass substrate, a non-alkali glass substrate, and/or the like.

Although the substrate 110 has been described as having four layers, the configuration of embodiments of the present disclosure is not limited thereto. For example, in some exemplary embodiments, the substrate 110 may include a single layer or a plurality of layers.

The buffer layer 115 may be on the substrate 110. For example, the buffer layer 115 may be over the whole of the display area 10 and the pad area 60 on the substrate 110. The buffer layer 115 may prevent or reduce diffusion of metal atoms or impurities from the substrate 110 to the semiconductor element 250, and may control a heat transfer rate (e.g., may reduce a heat transfer rate) during a crystallization process for forming the active layer 130 to obtain a substantially uniform active layer 130. In some embodiments, when a surface of the substrate 110 is not uniform, the buffer layer 115 may serve to improve flatness of the surface of the substrate 110 (e.g., the buffer layer 115 may planarize the surface of the substrate 110). Depending on a type or composition of the substrate 110, at least two buffer layers 115 may be provided on the substrate 110, or the buffer layer 115 may not be provided (e.g., the buffer layer 115 may be omitted). The buffer layer 115 may include a silicon compound, a metal oxide, and/or the like.

The active layer 130 may be in the display area 10 (or the pixel area 30) on the buffer layer 115. The active layer 130 may include a metal oxide semiconductor, an inorganic semiconductor (e.g., amorphous silicon or poly silicon semiconductor), an organic semiconductor, and/or the like. The active layer 130 may have a source region, a drain region, and a channel region located between the source region and the drain region.

The gate insulating layer 150 may be on the active layer 130. The gate insulating layer 150 may cover the active layer 130 in the display area 10 on the buffer layer 115, and may extend in a fourth direction D4 (e.g., a direction opposite to the third direction D3) which is a direction extending from the display area 10 to the pad area 60. In some embodiments, the gate insulating layer 150 may be over the whole of the display area 10 and the pad area 60 on the buffer layer 115. For example, the gate insulating layer 150 may suitably or sufficiently cover the active layer 130 on the buffer layer 115, and may have a substantially flat top surface without (or substantially without) creating a step around the active layer 130. In some embodiments, the gate insulating layer 150 may be located along a profile of the active layer 130 with a uniform (e.g., substantially uniform) thickness to cover the active layer 130 on the buffer layer 115. The gate insulating layer 150 may include a silicon compound, a metal oxide, and/or the like. In some exemplary embodiments, the gate insulating layer 150 may have a multilayer structure including a plurality of insulating layers. The insulating layers may include mutually different materials and may have mutually different thicknesses.

The first gate electrode 170 may be in the display area 10 on the gate insulating layer 150. The first gate electrode 170 may be at a portion of the gate insulating layer 150 under which the active layer 130 is located (e.g., to overlap the channel region of the active layer 130). The first gate electrode 170 may include a metal, an alloy, a metal nitride, a conductive metal oxide, a transparent conductive material, and/or the like. The foregoing may be used alone or in combination with each other. In some exemplary embodiments, the first gate electrode 170 may have a multilayer structure including a plurality of metal layers. The metal layers may include mutually different materials and may have mutually different thicknesses.

The first interlayer insulating layer 190 may be on the first gate electrode 170. The first interlayer insulating layer 190 may cover the first gate electrode 170 in the display area 10 on the gate insulating layer 150, and may extend in the fourth direction D4. In some embodiments, the first interlayer insulating layer 190 may be over the whole of the display area 10 and the pad area 60 on the gate insulating layer 150. For example, the first interlayer insulating layer 190 may suitably or sufficiently cover the first gate electrode 170 on the gate insulating layer 150, and may have a substantially flat top surface without (or substantially without) creating a step around the first gate electrode 170. In some embodiments, the first interlayer insulating layer 190 may be located along a profile of the first gate electrode 170 with a uniform (e.g., substantially uniform) thickness to cover the first gate electrode 170 on the gate insulating layer 150. The first interlayer insulating layer 190 may include a silicon compound, a metal oxide, and/or the like. In some exemplary embodiments, the first interlayer insulating layer 190 may have a multilayer structure including a plurality of insulating layers. The insulating layers may include mutually different materials and may have mutually different thicknesses.

The second gate electrode 175 may be in the display area 10 on the first interlayer insulating layer 190. The second gate electrode 175 may be at a portion of the first interlayer insulating layer 190 under which the first gate electrode 170 is located. In some embodiments, the first gate electrode 170 and the second gate electrode 175 may function as capacitors. The second gate electrode 175 may include a metal, an alloy, a metal nitride, a conductive metal oxide, a transparent conductive material, and/or the like. The foregoing may be used alone or in combination with each other. In some exemplary embodiments, the second gate electrode 175 may have a multilayer structure including a plurality of metal layers. The metal layers may include mutually different materials and may have mutually different thicknesses.

The second interlayer insulating layer 195 may be on the second gate electrode 175. The second interlayer insulating layer 195 may cover the second gate electrode 175 in the display area 10 on the first interlayer insulating layer 190, and may extend in the fourth direction D4. In some embodiments, the second interlayer insulating layer 195 may be over the whole of the display area 10 and the pad area 60 on the first interlayer insulating layer 190. For example, the second interlayer insulating layer 195 may suitably or sufficiently cover the second gate electrode 175 on the first interlayer insulating layer 190, and may have a substantially flat top surface without (or substantially without) creating a step around the second gate electrode 175. In some embodiments, the second interlayer insulating layer 195 may be located along a profile of the second gate electrode 175 with a uniform (e.g., substantially uniform) thickness to cover the second gate electrode 175 on the first interlayer insulating layer 190. The second interlayer insulating layer 195 may include a silicon compound, a metal oxide, and/or the like. In some exemplary embodiments, the second interlayer insulating layer 195 may have a multilayer structure including a plurality of insulating layers. The insulating layers may include mutually different materials and may have mutually different thicknesses.

The source electrode 210 and the drain electrode 230 may be in the display area 10 on the second interlayer insulating layer 195. The source electrode 210 may be coupled to the source region of the active layer 130 through a contact hole formed by removing first portions of the gate insulating layer 150, the first interlayer insulating layer 190, and the second interlayer insulating layer 195, and the drain electrode 230 may be coupled to the drain region of the active layer 130 through a contact hole formed by removing second portions of the gate insulating layer 150, the first interlayer insulating layer 190, and the second interlayer insulating layer 195. Each of the source electrode 210 and the drain electrode 230 may include a metal, an alloy, a metal nitride, a conductive metal oxide, a transparent conductive material, and/or the like. The foregoing may be used alone or in combination with each other. In some exemplary embodiments, each of the source electrode 210 and the drain electrode 230 may have a multilayer structure including a plurality of metal layers. The metal layers may include mutually different materials and may have mutually different thicknesses.

Accordingly, the semiconductor element 250 including the active layer 130, the gate insulating layer 150, the first gate electrode 170, the first interlayer insulating layer 190, the second gate electrode 175, the second interlayer insulating layer 195, the source electrode 210, and the drain electrode 230, and located in the display area 10 between the substrate 110 and the pixel structure 200 may be provided.

Although the semiconductor element 250 has been described as having a top gate structure, the configuration of embodiments of the present disclosure is not limited thereto. For example, the semiconductor element 250 may have a bottom gate structure.

In addition, although the display device 100 has been described as including one semiconductor element, the configuration of embodiments of the present disclosure is not limited thereto. For example, the display device 100 may include at least one semiconductor element and at least one capacitor.

Referring to FIGS. 2 and 3, the first lighting wire 715 may be in the lighting wire area 90 on the second interlayer insulating layer 195. The first lighting wire 715 may be spaced apart from a first side of the driving integrated circuit part 600 in the first direction D1, and may extend in the first direction D1 so as to be coupled to the lighting circuit part 700. In exemplary embodiments, the first lighting wire 715 may not overlap the driving integrated circuit part 600. The first lighting wire 715 may include a metal, an alloy, a metal nitride, a conductive metal oxide, a transparent conductive material, and/or the like. The foregoing may be used alone or in combination with each other. In some exemplary embodiments, the first lighting wire 715 may have a multilayer structure including a plurality of metal layers. The metal layers may include mutually different materials and may have mutually different thicknesses.

The second lighting wire 710 may be in the pad area 60 on the second interlayer insulating layer 195. The second lighting wire 710 may be spaced apart from a second side opposite to the first side of the driving integrated circuit part 600 in the second direction D2, and may extend in the second direction D2 and the fourth direction D4 so as to be coupled to the pad electrode 470. In exemplary embodiments, the second lighting wire 710 may not overlap the driving integrated circuit part 600. The second lighting wire 710 may include a metal, an alloy, a metal nitride, conductive metal oxide, a transparent conductive material, and/or the like. The foregoing may be used alone or in combination with each other. In some exemplary embodiments, the second lighting wire 710 may have a multilayer structure including a plurality of metal layers. The metal layers may include mutually different materials and may have mutually different thicknesses.

In exemplary embodiments, the source electrode 210, the drain electrode 230, the first lighting wire 715, the second lighting wire 710, the third lighting wire 725, and the fourth lighting wire 720 may be located on the same layer, and may include the same (e.g., substantially the same) material. For example, each of the source electrode 210, the drain electrode 230, the first lighting wire 715, the second lighting wire 710, the third lighting wire 725, and the fourth lighting wire 720 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and/or the like.

In some exemplary embodiments, a protective insulating layer may be on the second interlayer insulating layer 195, the source and drain electrodes 210 and 230, the first lighting wire 715, the second lighting wire 710, the third lighting wire 725, and the fourth lighting wire 720. The protective insulating layer may cover the source and drain electrodes 210 and 230 in the display area 10 on the second interlayer insulating layer 195, and may cover the first lighting wire 715, the second lighting wire 710, the third lighting wire 725, and the fourth lighting wire 720 in the pad area 60 on the second interlayer insulating layer 195. In exemplary embodiments, the protective insulating layer may include an inorganic insulating material.

The first planarization layer 270 may be on the second interlayer insulating layer 195, the source and drain electrodes 210 and 230, and the first to fourth lighting wires 715, 710, 725, and 720. The first planarization layer 270 may be in the display area 10 and a portion of the pad area 60 on the second interlayer insulating layer 195. In some embodiments, the first planarization layer 270 may extend in the fourth direction D4 to cover the source and drain electrodes 210 and 230 in the display area 10 on the second interlayer insulating layer 195, and may cover the first to fourth lighting wires 715, 710, 725, and 720 in the pad area 60. In addition, the first planarization layer 270 may include a first opening 274 which exposes a top surface of the second interlayer insulating layer 195 located in the first circuit area 80.

The first planarization layer 270 may have a relatively thick thickness. In some embodiments, the first planarization layer 270 may have a substantially flat top surface. In order to implement such a flat top surface of the first planarization layer 270, a planarization process may be additionally performed on the first planarization layer 270. In some embodiments, the first planarization layer 270 may be located along a profile of the source and drain electrodes 210 and 230 and the first to fourth lighting wires 715, 710, 725, and 720 with a uniform (e.g., substantially uniform) thickness on the second interlayer insulating layer 195. The first planarization layer 270 may be formed of an organic insulating material and/or an inorganic insulating material. In exemplary embodiments, the first planarization layer 270 may include an organic insulating material. For example, the first planarization layer 270 may include a photoresist, a polyacryl-based resin, a polyimide-based resin, a polyamide-based resin, a siloxane-based resin, an acryl-based resin, an epoxy-based resin, and/or the like.

The wire pattern 215 and the connection pattern 235 may be in the display area 10 on the first planarization layer 270. The wire pattern 215 may transmit a gate signal, a data signal, an emission control signal, a gate initialization signal, a power supply voltage, and/or the like. The connection pattern 235 may be in the display area 10 on the first planarization layer 270 while being spaced apart from the wire pattern 215. The connection pattern 235 may be coupled to the drain electrode 230 through a contact hole formed by removing a portion of the first planarization layer 270 located in the display area 10, and the connection pattern 235 may electrically couple the lower electrode 290 to the drain electrode 230. In some embodiments, the connection pattern 235 may not be coupled to the drain electrode 230, and may electrically couple the semiconductor element 250 to another semiconductor element through the contact hole when viewed in another cross-sectional view of the display device 100. Each of the wire pattern 215 and the connection pattern 235 may include a metal, an alloy, a metal nitride, a conductive metal oxide, a transparent conductive material, and/or the like. The foregoing may be used alone or in combination with each other. In some exemplary embodiments, each of the wire pattern 215 and the connection pattern 235 may have a multilayer structure including a plurality of metal layers. The metal layers may include mutually different materials and may have mutually different thicknesses.

The second planarization layer 275 may be on the wire pattern 215, the connection pattern 235, and the first planarization layer 270. The second planarization layer 275 may be in the display area 10 and a portion of the pad area 60 on the first planarization layer 270. For example, the second planarization layer 275 may extend in the fourth direction D4 to cover the wire pattern 215 and the connection pattern 235 in the display area 10 on the first planarization layer 270, and may be on the first planarization layer 270 in the pad area 60. In some embodiments, the second planarization layer 275 may include a second opening 279 which exposes the top surface of the second interlayer insulating layer 195 located in the first circuit area 80.

The second planarization layer 275 may have a relatively thick thickness. In this case, the second planarization layer 275 may have a substantially flat top surface. In order to implement such a flat top surface of the second planarization layer 275, a planarization process may be additionally performed on the second planarization layer 275. In some embodiments, the second planarization layer 275 may be located along a profile of the wire pattern 215 and the connection pattern 235 with a uniform (e.g., substantially uniform) thickness on the first planarization layer 270. The second planarization layer 275 may be formed of an organic insulating material and/or an inorganic insulating material. In exemplary embodiments, the second planarization layer 275 may include an organic insulating material.

The lower electrode 290 may be in the display area 10 on the second planarization layer 275. The lower electrode 290 may be coupled to the connection pattern 235 through a contact hole formed by removing a portion of the second planarization layer 275, and the lower electrode 290 may be electrically coupled to the semiconductor element 250. The lower electrode 290 may include a metal, an alloy, a metal nitride, a conductive metal oxide, a transparent conductive material, and/or the like. The foregoing may be used alone or in combination with each other. In some exemplary embodiments, the lower electrode 290 may have a multi-layer structure including a plurality of metal layers. The metal layers may include mutually different materials and may have mutually different thicknesses.

The pixel defining layer 310 may be in the display area 10 on the second planarization layer 275. In some embodiments, the pixel defining layer 310 may not be in the pad area 60. The pixel defining layer 310 may expose a portion of the lower electrode 290 in the display area 10. The pixel defining layer 310 may be formed of an organic insulating material and/or an inorganic insulating material. In exemplary embodiments, the pixel defining layer 310 may include an organic insulating material.

The organic light emitting layer 330 may be on the lower electrode 290. The organic light emitting layer 330 may be formed by using at least one of light emitting materials for emitting different color lights (e.g., red light, green light, blue light, etc.) according to the pixel. In some embodiments, the organic light emitting layer 330 may be formed by stacking a plurality of light emitting materials for generating different color lights such as red light, green light, and blue light to emit white light as a whole. In this case, a color filter may be on the organic light emitting layer 330 which is on the lower electrode 290. The color filter may include at least one of a red color filter, a green color filter, and a blue color filter. In some embodiments, the color filter may include a yellow color filter, a cyan color filter, and/or a magenta color filter. The color filter may include a photosensitive resin and/or a color photoresist.

The upper electrode 340 may be over the whole display area 10 on the substrate 110. The upper electrode 340 may be located along a profile of the organic light emitting layer 330 and the pixel defining layer 310. The upper electrode 340 may include a metal, an alloy, a metal nitride, a conductive metal oxide, a transparent conductive material, and/or the like. The foregoing may be used alone or in combination with each other. In some exemplary embodiments, the upper electrode 340 may have a multilayer structure including a plurality of metal layers. The metal layers may include mutually different materials and may have mutually different thicknesses.

Accordingly, the pixel structure 200 including the lower electrode 290, the organic light emitting layer 330, and the upper electrode 340 may be provided.

The first inorganic thin film encapsulation layer 451 may be in the display area 10 on the upper electrode 340. For example, the first inorganic thin film encapsulation layer 451 may be located along a profile of the upper electrode 340 in the display area 10. The first inorganic thin film encapsulation layer 451 may prevent or reduce deterioration of the pixel structure 200 due to penetration of moisture, oxygen, and/or the like. In addition, the first inorganic thin film encapsulation layer 451 may function to protect the pixel structure 200 from an external impact. The first inorganic thin film encapsulation layer 451 may include an inorganic insulating material having flexibility.

The organic thin film encapsulation layer 452 may be in the display area 10 on the first inorganic thin film encapsulation layer 451. The organic thin film encapsulation layer 452 may improve flatness of the display device 100, and may protect the pixel structure 200 together with the first inorganic thin film encapsulation layer 451. The organic thin film encapsulation layer 452 may include an organic insulating material having flexibility.

The second inorganic thin film encapsulation layer 453 may be on the organic thin film encapsulation layer 452. The second inorganic thin film encapsulation layer 453 may be located along a profile of the organic thin film encapsulation layer 452 with a uniform (e.g., substantially uniform) thickness to cover the organic thin film encapsulation layer 452 in the display area 10. The second inorganic thin film encapsulation layer 453 may prevent or reduce deterioration of the pixel structure 200 due to the penetration of moisture, oxygen, and/or the like together with the first inorganic thin film encapsulation layer 451. In some embodiments, the second inorganic thin film encapsulation layer 453 may function to protect the pixel structure 200 from an external impact together with the first inorganic thin film encapsulation layer 451 and the organic thin film encapsulation layer 452. The second inorganic thin film encapsulation layer 453 may include an inorganic insulating material having flexibility.

Accordingly, the thin film encapsulation structure 450 including the first inorganic thin film encapsulation layer 451, the organic thin film encapsulation layer 452, and the second inorganic thin film encapsulation layer 453 may be provided. In some embodiments, the thin film encapsulation structure 450 may have a five-layer structure in which first to fifth thin film encapsulation layers are stacked or a seven-layer structure in which first to seventh thin film encapsulation layers are stacked.

Referring again to FIGS. 3 and 4, the insulating layer 381 may be on the second inorganic thin film encapsulation layer 453, the second planarization layer 275, the first planarization layer 270, and the second interlayer insulating layer 195. The insulating layer 381 may be on the second inorganic thin film encapsulation layer 453 in the display area 10, and may extend in the fourth direction D4 so as to be located along a profile of the second planarization layer 275, the first planarization layer 270, and the second interlayer insulating layer 195 in the pad area 60. For example, in some embodiments, the insulating layer 381 may be over the whole of the display area 10 and the pad area 60 on the substrate 110. For example, the insulating layer 381 may be located along a profile of the second inorganic thin film encapsulation layer 453, the second planarization layer 275, the first planarization layer 270, and the second interlayer insulating layer 195 with a uniform (e.g., substantially uniform) thickness on the second inorganic thin film encapsulation layer 453, the second planarization layer 275, the first planarization layer 270, and the second interlayer insulating layer 195.

In exemplary embodiments, in the first circuit area 80, a top surface of the insulating layer 381 may make direct contact (e.g., physical contact) with the first connection electrode 730, and a bottom surface of the insulating layer 381 may make direct contact (e.g., physical contact) with the second interlayer insulating layer 195. The insulating layer 381 may include a silicon compound, metal oxide, and/or the like. In some exemplary embodiments, the insulating layer 381 may have a multilayer structure including a plurality of insulating layers. The insulating layers may include mutually different materials and may have mutually different thicknesses.

Depending on a type or composition of the insulating layer 381, the insulating layer 381 may be provided on the thin film encapsulation structure 450, or the insulating layer 381 may not be provided. When the insulating layer 381 is not provided, a first sensing electrode 382 and a second sensing electrode 384 may be formed directly on (e.g., physically contacting) the thin film encapsulation structure 450. In this case, a bottom surface of the first connection electrode 730 and a bottom surface of the second connection electrode 740 may make direct contact (e.g., physical contact) with the second interlayer insulating layer 195 in the first circuit area 80.

The first and second sensing electrodes 382 and 384 may be in the display area 10 on the insulating layer 381. Each of the first sensing electrodes 382 may extend in the third direction D3 (or the fourth direction D4), and the first sensing electrodes 382 may be spaced apart from each other in the first direction D1 (or the second direction D2). The second sensing electrodes 384 may be between two adjacent first sensing electrodes 382 among the first sensing electrodes 382 while being spaced apart from each other in the third direction D3. For example, each of the first and second sensing electrodes 382 and 384 may include carbon nanotubes (CNT), transparent conductive oxide such as $ZnO_x$, ITO, $SnO_x$, $InO_x$, $GaO_x$, IZO, and/or indium gallium zinc oxide (IGZO), graphene, silver nanowires (Ag nanowires; AgNW), Cu, Cr, and/or the like.

The first and second connection electrodes 730 and 740 may be on the second planarization layer 275, the first planarization layer 270, and the second interlayer insulating layer 195 located in the pad area 60 while being spaced apart from each other. Each of the first and second connection electrodes 730 and 740 may be located along a profile of the second planarization layer 275, the first planarization layer 270, and the second interlayer insulating layer 195 in the pad area 60, and may be between the driving integrated circuit part 600 and the substrate 110 (or the insulating layer 381) in the first circuit area 80. As described above, when the insulating layer 381 is not provided, each of the first and second connection electrodes 730 and 740 may make direct contact (e.g., physical contact) with the second interlayer insulating layer 195. The first connection electrode 730 may be coupled to the first lighting wire 715 and the second lighting wire 710 through the first contact hole 732 and the second contact hole 731 formed in the first and second planarization layers 270 and 275, respectively. For example, in some embodiments, the first connection electrode 730 may electrically couple the first lighting wire 715 to the second lighting wire 710. In addition, the second connection electrode 740 may be coupled to the third lighting wire 725 and the fourth lighting wire 720 through the third contact hole 742 and the fourth contact hole 741 formed in the first and second planarization layers 270 and 275, respectively. For example, in some embodiments, the second connection electrode 740 may electrically couple the third lighting wire 725 to the fourth lighting wire 720.

Each of the first and second connection electrodes 730 and 740 may include a metal, an alloy, a metal nitride, a conductive metal oxide, a transparent conductive material, and/or the like. The foregoing may be used alone or in combination with each other. In some exemplary embodiments, each of the first and second connection electrodes 730 and 740 may have a multilayer structure including a plurality of metal layers. The metal layers may include mutually different materials and may have mutually different thicknesses.

In exemplary embodiments, the first sensing electrode 382, the second sensing electrode 384, the first connection electrode 730, and the second connection electrode 740 may include the same (e.g., substantially the same) material.

For example, in order to perform the lighting inspection, a lighting circuit part 700, lighting wires electrically coupled to the lighting circuit part 700 to transmit lighting inspection signals, and a connection electrode configured to couple the lighting wires to each other may be in an existing display device. In an existing display device, the connection electrode configured to couple the lighting wires to each other is formed concurrently (e.g., simultaneously) with the wire pattern 215 and the connection pattern 235 in the same process. In some embodiments, in a process of forming the lower electrode 290 by forming a preliminary electrode layer and partially etching the preliminary electrode layer, an etchant used in the etching process may etch a portion of the connection electrode. For example, in some embodiments, an undercut may be generated in the connection electrode due to the etchant. When an insulating layer is on the partially etched connection electrode, the insulating layer may be cut on a side surface of the connection electrode due to the undercut. In this case, the connection electrode may be exposed to an outside, and the connection electrode exposed to the outside may be corroded. Accordingly, the lighting inspection may not be accurately performed.

In exemplary embodiments of the present disclosure, because the first connection electrode 730 and the second connection electrode 740 are formed concurrently (e.g., simultaneously) with the first sensing electrode 382 and the second sensing electrode 384 in the same process, the first connection electrode 730 and the second connection electrode 740 are formed later than the lower electrode 290, so that the first sensing electrode 382 and the second sensing electrode 384 may not make contact (e.g., physical contact) with the etchant used to form the lower electrode 290. Accordingly, an undercut phenomenon may not occur due to the etchant in the first connection electrode 730 and the second connection electrode 740, and the first insulating layer 395 may completely cover the first connection electrode 730 and the second connection electrode 740.

The first insulating layer 395 may be on the insulating layer 381, the first sensing electrode 382, the second sensing electrode 384, the first connection electrode 730, and the second connection electrode 740. The first insulating layer 395 may cover the first sensing electrode 382 and the second sensing electrode 384 in the display area 10 on the insulating layer 381, and may extend in the fourth direction D4 to cover the first connection electrode 730 and the second connection electrode 740 in the pad area 60 on the insulating layer 381. For example, in some embodiments, the first insulating layer 395 may be over the whole of the display area 10 and the pad area 60 on the insulating layer 381. For example, the first insulating layer 395 may be located along a profile of the first and second sensing electrodes 382 and 384 and the first and second connection electrodes 730 and 740 with a uniform (e.g., substantially uniform) thickness to cover the first and second sensing electrodes 382 and 384 and the first and second connection electrodes 730 and 740 on the insulating layer 381. In some embodiments, the first insulating layer 395 may suitably or sufficiently cover the first and second sensing electrodes 382 and 384 and the first and second connection electrodes 730 and 740 on the insulating layer 381, and may have a substantially flat top surface without (or substantially without) creating a step around the first and second sensing electrodes 382 and 384 and the first and second connection electrodes 730 and 740. In exemplary embodiments, the first insulating layer 395 may make direct contact (e.g., physical contact) with a bottom surface of the driving integrated circuit part 600, a top surface of the first connection electrode 730, and a top surface of the second connection electrode 740 in the pad area 60. The first insulating layer 395 may include a silicon compound, metal oxide, and/or the like. For example, the first insulating layer 395 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and/or the like. In some exemplary embodiments, the first insulating layer 395 may have a multilayer structure including a plurality of insulating layers. The insulating layers may include mutually different materials and may have mutually different thicknesses.

The sensing connection electrodes 386 may be in the display area 10 on the first insulating layer 395. Each of the sensing connection electrodes 386 may electrically couple two second sensing electrodes 384, which are adjacent to each other in the first direction D1 among the second sensing electrodes 384, to each other through contact holes formed by removing a portion of the first insulating layer 395. For example, the sensing connection electrodes 386 may include the same (e.g., substantially the same) material as the first and second sensing electrodes 382 and 384.

The second insulating layer 398 may be on the first insulating layer 395 and the sensing connection electrodes 386. The second insulating layer 398 may cover the sensing connection electrodes 386 in the display area 10 on the first insulating layer 395, and may not be in the pad area 60. The second insulating layer 398 may include an organic insulating material or an inorganic insulating material. In some exemplary embodiments, the second insulating layer 398 may be formed in the pad area 60.

Accordingly, the sensing structure 380 including the insulating layer 381, the first sensing electrodes 382, the second sensing electrodes 384, the first insulating layer 395, the sensing connection electrodes 386, and the second insulating layer 398 may be provided.

For example, the sensing structure 380 may be substantially transparent. The light emitted from the organic light emitting layer 330 may pass through the sensing structure 380. In addition, the sensing structure 380 may sense a portion of a user body, an object, and/or the like, which is located over the top surface of the display device 100, through the first sensing electrodes 382, the second sensing electrodes 384, and the sensing connection electrodes 386. For example, in some embodiments, the external device may generate a sensing signal, and the sensing signal generated from the external device may be transmitted to the first sensing electrodes 382, the second sensing electrodes 384, and the sensing connection electrodes 386. The external device may receive the sensing signal transmitted to the first sensing electrodes 382, the second sensing electrodes 384, and the sensing connection electrodes 386 to sense the portion of the user body, the object, and/or the like located over a front surface of the display device 100. In exemplary embodiments, the first sensing electrodes 382 and the second sensing electrodes 384 may include a proximity sensor electrode for sensing proximity of a user and/or an object with respect to the top surface of the display device 100, or a touch sensor electrode for sensing a touch of a portion of a user body.

The driving integrated circuit part 600 may be in the first circuit area 80 on the first insulating layer 395. In exemplary embodiments, the driving integrated circuit part 600 may be inside the first opening 274 and the second opening 279. The first side of the driving integrated circuit part 600 (e.g., a portion of an inner side surface of the driving integrated circuit part 600) and the first lighting wire 715 may be adjacent to each other, and the second side of the driving integrated circuit part 600 (e.g., a portion of an outer side surface of the driving integrated circuit part 600) and the second lighting wire 710 may be adjacent to each other.

As described above, the display device 100 shown in FIGS. 1 to 4 may be provided.

Because the display device 100 according to exemplary embodiments of the present disclosure includes the first and second connection electrodes 730 and 740 which are formed concurrently (e.g., simultaneously) with the first and second sensing electrodes 382 and 384 in the same process, the first and second connection electrodes 730 and 740 are formed after the lower electrode 290 is formed, so that the etchant used to form the lower electrode 290 may not make contact (e.g., physical contact) with the first and second connection electrodes 730 and 740. For example, in some embodiments, the undercut phenomenon may not occur due to the etchant in the first and second connection electrodes 730 and 740, and the first insulating layer 395 may completely cover the first and second connection electrodes 730 and 740 such that the first and second connection electrodes 730 and 740 are not exposed to the outside. Accordingly, the first and second connection electrodes 730 and 740 are not exposed to the outside, so that the first and second connection electrodes 730 and 740 may not be corroded, and the lighting inspection for the display device 100 may be accurately performed.

Although the display device 100 according to the present disclosure has been described as being an organic light emitting diode display device, the configuration of embodiments of the present disclosure is not limited thereto. In some exemplary embodiments, the display device 100 may include a liquid crystal display device (LCD), a field emission display device (FED), a plasma display device (PDP), and/or an electrophoretic image display device (EPD).

Figure 5:
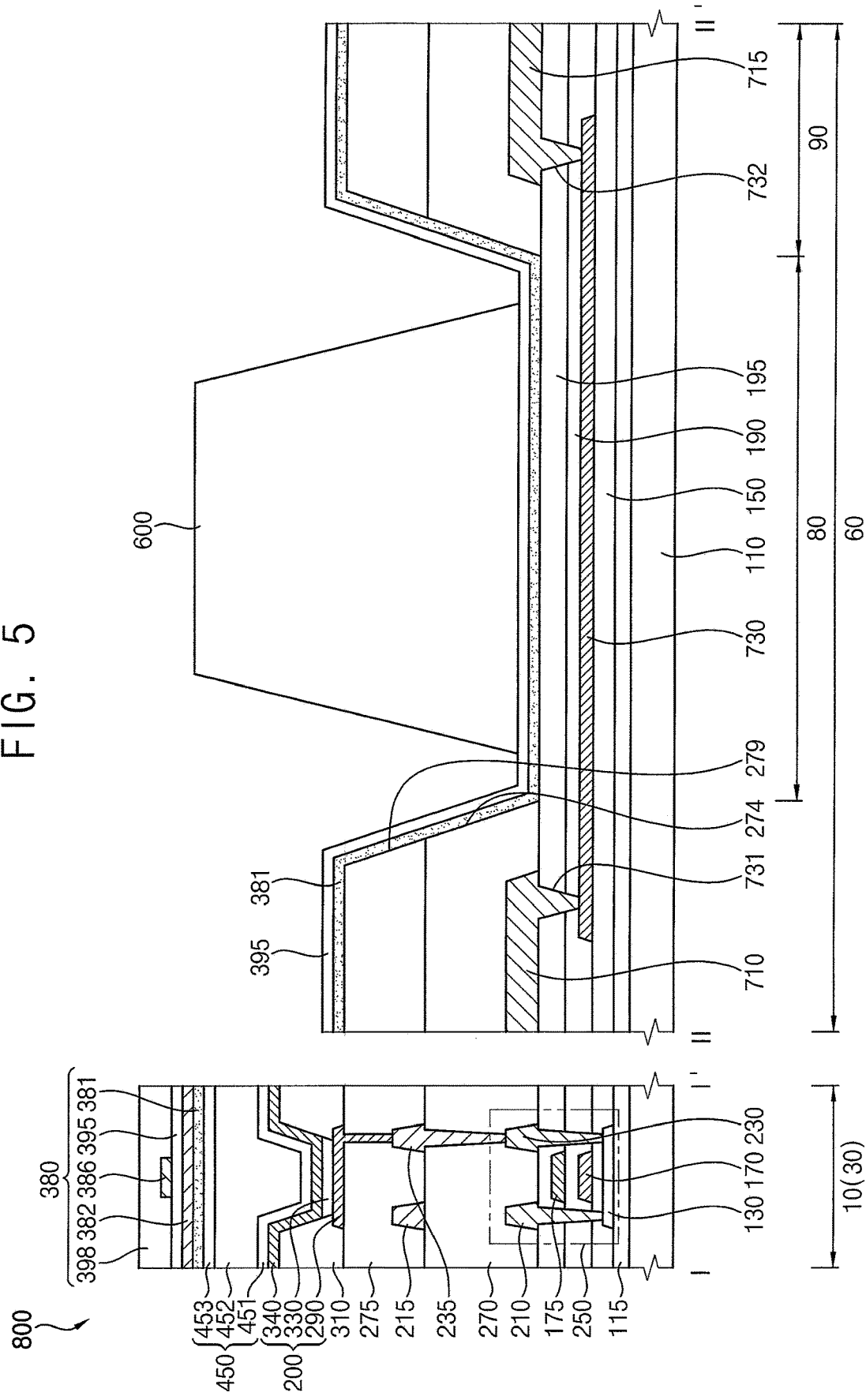
FIG. 5 is a cross-sectional view showing a display device according to exemplary embodiments of the present disclosure.
Figure 6:
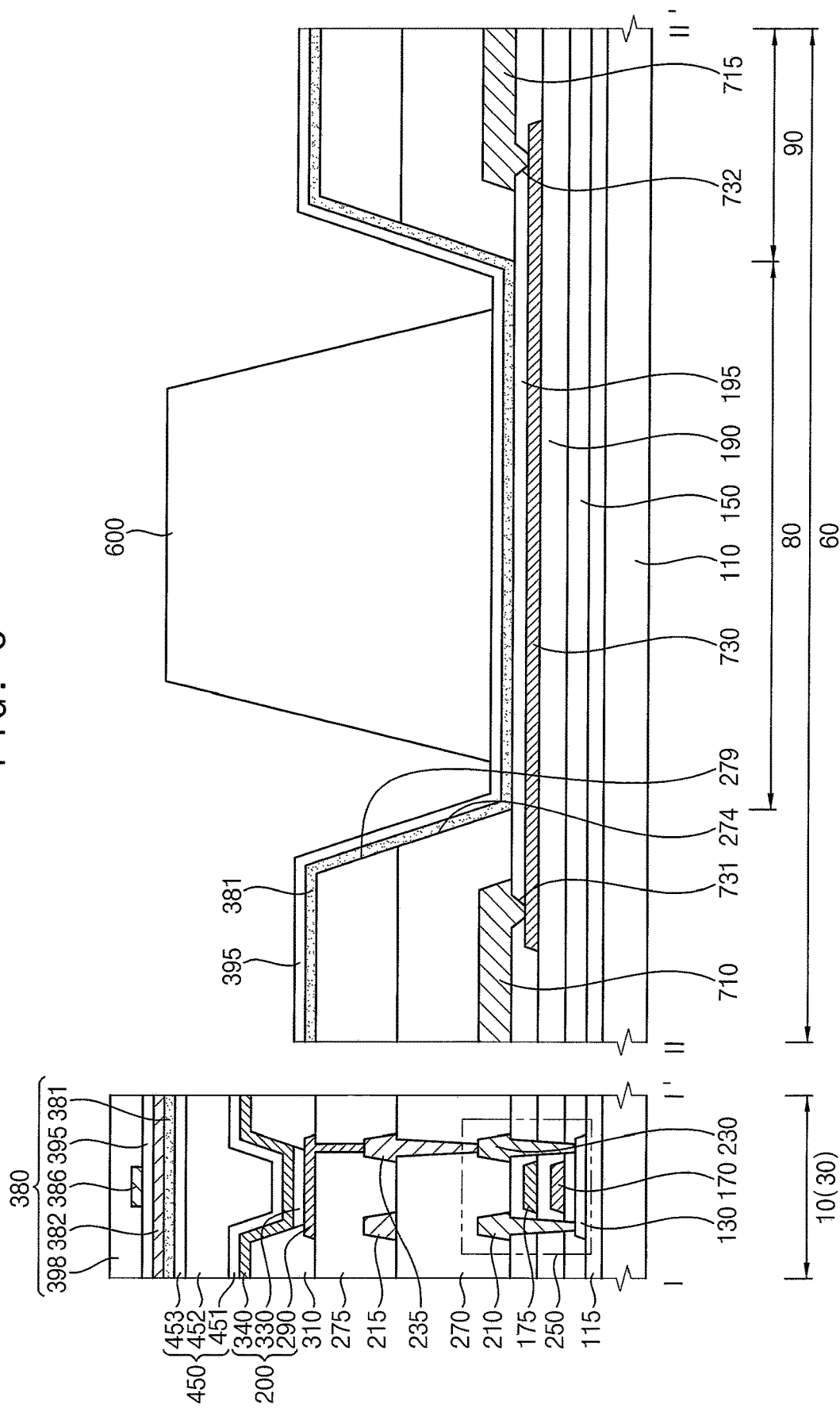
FIG. 6 is a cross-sectional view showing one example of the display device of FIG. 5.

FIG. 5 is a cross-sectional view showing a display device according to exemplary embodiments of the present disclosure, and FIG. 6 is a cross-sectional view showing one example of the display device of FIG. 5. A display device 800 illustrated in FIG. 5 may have a configuration which is substantially identical or similar to the configuration of the display device 100 described with reference to FIGS. 1 to 4 except for a position of the first connection electrode 730. In FIG. 5, redundant descriptions of components which are substantially identical or similar to the components described with reference to FIGS. 1 to 4 will not be repeated here.

Referring to FIG. 5, the display device 800 may include a substrate 110, a buffer layer 115, a semiconductor element 250, a first lighting wire 715, a second lighting wire 710, a third lighting wire 725, a fourth lighting wire 720, a first planarization layer 270, a wire pattern 215, a connection pattern 235, a second planarization layer 275, a first connection electrode 730, a second connection electrode 740, a pixel structure 200, a pixel defining layer 310, a thin film encapsulation structure 450, a sensing structure 380, a driving integrated circuit part 600, a lighting circuit part 700, pad electrodes 470, and/or the like. In some embodiments, the semiconductor element 250 may include an active layer 130, a gate insulating layer 150, a first gate electrode 170, a first interlayer insulating layer 190, a second gate electrode 175, a second interlayer insulating layer 195, a source electrode 210, and a drain electrode 230. In some embodiments, the display device 800 may include a display area 10 and a pad area 60. In some embodiments, the display area 10 may include pixel areas 30, and the pad area 60 may include a first circuit area 80, a second circuit area 70, and a lighting wire area 90.

The first connection electrode 730 may be in the pad area 60 on the first interlayer insulating layer 190. The first lighting wire 715 may be coupled to a first portion of the first connection electrode 730 through a first contact hole 732 formed in first portions of the first and second interlayer insulating layers 190 and 195, and the second lighting wire 710 may be coupled to a second portion opposite to the first portion of the first connection electrode 730 through a second contact hole 731 formed in second portions of the first and second interlayer insulating layers 190 and 195. For example, in some embodiments, the first connection electrode 730 may electrically couple the first lighting wire 715 to the second lighting wire 710. The first connection electrode 730 may include a metal, an alloy, a metal nitride, a conductive metal oxide, a transparent conductive material, and/or the like. The foregoing may be used alone or in combination with each other. In some exemplary embodiments, the first connection electrode 730 may have a multilayer structure including a plurality of metal layers. The metal layers may include mutually different materials and may have mutually different thicknesses.

In exemplary embodiments, the first gate electrode 170, the first connection electrode 730, and the second connection electrode 740 may be located on the same layer, and may include the same (e.g., substantially the same) material. For example, in the first circuit area 80, dummy electrodes may be further provided between the first and second connection electrodes 730 and 740 and the substrate 110. When the first and second connection electrodes 730 and 740 are located on the same layer as the first gate electrode 170, the dummy electrodes may be located on the same layer as the second gate electrode 175, the source and drain electrodes 210 and 230, or the wire and connection patterns 215 and 235.

In some exemplary embodiments, as shown in FIG. 6, the second gate electrode 175, the first connection electrode 730, and the second connection electrode 740 may be located on the same layer, and may include the same (e.g., substantially the same) material. For example, in the first circuit area 80, the dummy electrodes may be further provided between the first and second connection electrodes 730 and 740 and the substrate 110. When the first and second connection electrodes 730 and 740 are located on the same layer as the second gate electrode 175, the dummy electrodes may be located on the same layer as the first gate electrode 170, the source and drain electrodes 210 and 230, or the wire and connection patterns 215 and 235.

Because the display device 800 according to exemplary embodiments of the present disclosure includes the first and second connection electrodes 730 and 740 which are formed concurrently (e.g., simultaneously) with the first gate electrode 170 or the second gate electrode 175 in the same process, the first interlayer insulating layer 190 and the second interlayer insulating layer 195 completely cover the first and second connection electrodes 730 and 740, so that the etchant used to form the lower electrode 290 may not make contact (e.g., physical contact) with the first and second connection electrodes 730 and 740. For example, in some embodiments, the undercut phenomenon may not occur due to the etchant in the first and second connection electrodes 730 and 740, and the first interlayer insulating layer 190 or the second interlayer insulating layer 195 may completely cover the first and second connection electrodes 730 and 740 such that the first and second connection electrodes 730 and 740 are not exposed to the outside. Accordingly, the first and second connection electrodes 730 and 740 are not exposed to the outside, so that the first and second connection electrodes 730 and 740 may not be corroded, and the lighting inspection for the display device 800 may be accurately performed.

Figure 7:
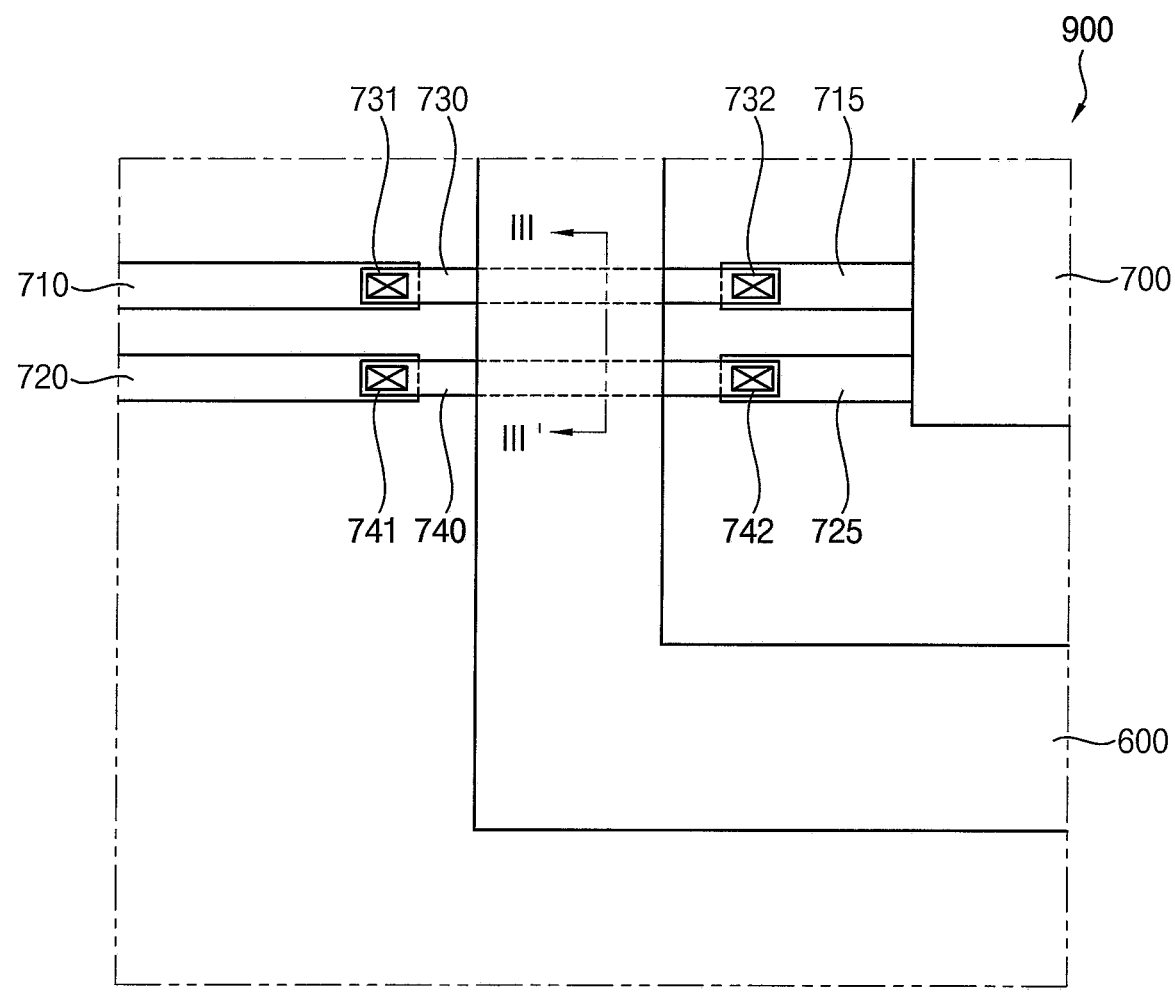
FIG. 7 is a partially enlarged plan view showing a display device according to exemplary embodiments of the present disclosure.
Figure 7:
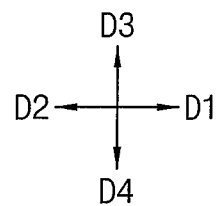
Figure 8:
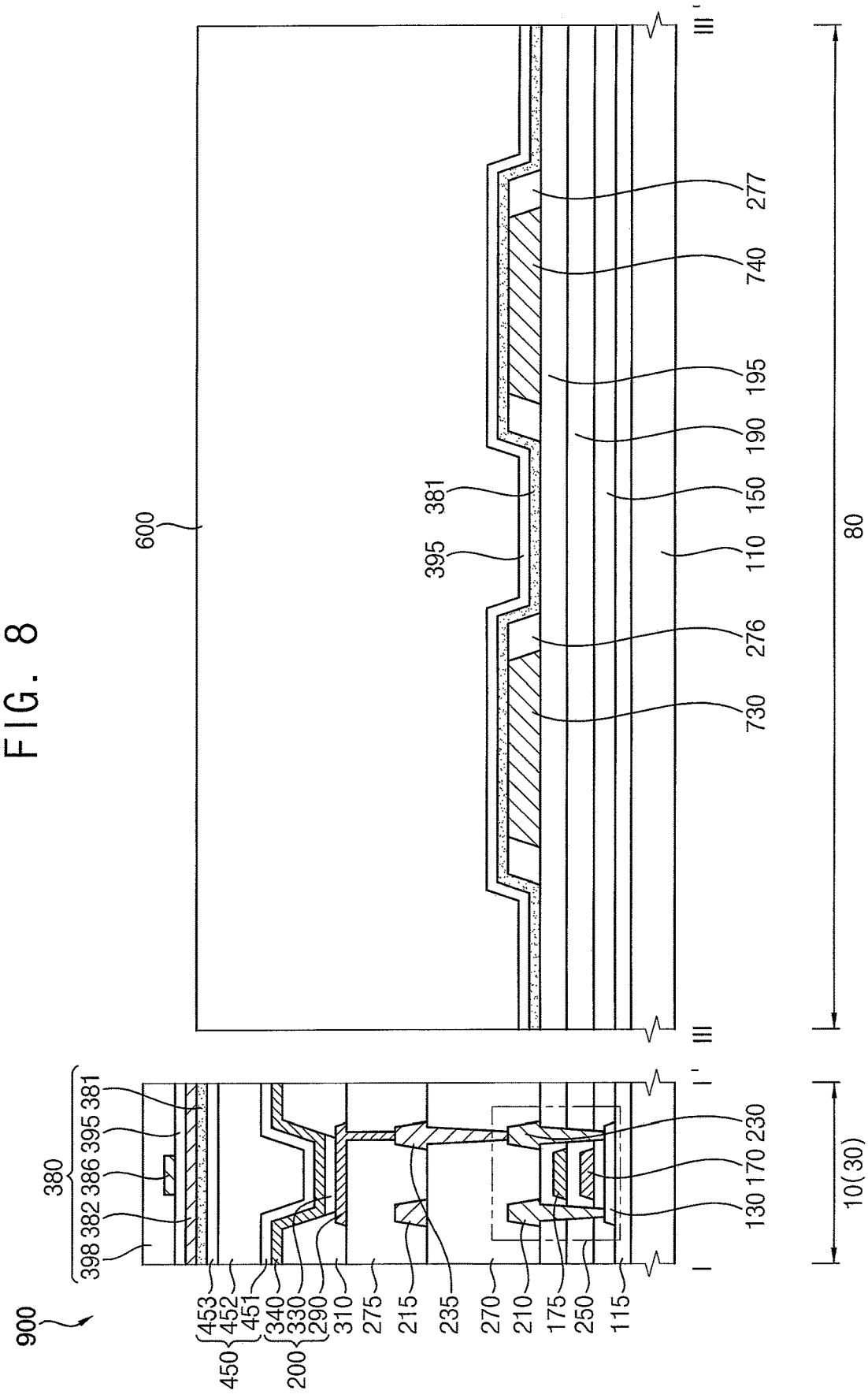
FIG. 8 is a cross-sectional view taken along line I-I' of FIG. 1 and line III-III' of FIG. 7.

FIG. 7 is a partially enlarged plan view showing a display device according to exemplary embodiments of the present disclosure, and FIG. 8 is a cross-sectional view taken along line I-I' of FIG. 1 and line III-III' of FIG. 7. A display device 900 illustrated in FIGS. 7 and 8 may have a configuration which is substantially identical or similar to the configuration of the display device 100 described with reference to FIGS. 1 to 4 except for a first insulating pattern 276 and a second insulating pattern 277. In FIGS. 7 and 8, redundant descriptions of components which are substantially identical or similar to the components described with reference to FIGS. 1 to 4 will not be repeated here.

Referring to FIGS. 7 and 8, the display device 900 may include a substrate 110, a buffer layer 115, a semiconductor element 250, a first lighting wire 715, a second lighting wire 710, a third lighting wire 725, a fourth lighting wire 720, a first planarization layer 270, a wire pattern 215, a connection pattern 235, a second planarization layer 275, a first connection electrode 730, a first insulating pattern 276, a second connection electrode 740, a second insulating pattern 277, a pixel structure 200, a pixel defining layer 310, a thin film encapsulation structure 450, a sensing structure 380, a driving integrated circuit part 600, a lighting circuit part 700, pad electrodes 470, and/or the like. In some embodiments, the semiconductor element 250 may include an active layer 130, a gate insulating layer 150, a first gate electrode 170, a first interlayer insulating layer 190, a second gate electrode 175, a second interlayer insulating layer 195, a source electrode 210, and a drain electrode 230. In some embodiments, the display device 900 may include a display area 10 and a pad area 60. In some embodiments, the display area 10 may include pixel areas 30, and the pad area 60 may include a first circuit area 80, a second circuit area 70, and a lighting wire area 90.

The first and second connection electrodes 730 and 740 may be on the second planarization layer 275, the first planarization layer 270, and the second interlayer insulating layer 195 located in the pad area 60 while being spaced apart from each other. Each of the first and second connection electrodes 730 and 740 may be located along a profile of the second planarization layer 275, the first planarization layer 270, and the second interlayer insulating layer 195 in the pad area 60. Each of the first and second connection electrodes 730 and 740 may include a metal, an alloy, a metal nitride, a conductive metal oxide, a transparent conductive material, and/or the like. The foregoing may be used alone or in combination with each other.

In exemplary embodiments, the wire pattern 215, the connection pattern 235, and the first and second connection electrodes 730 and 740 may include the same (e.g., substantially the same) material.

The first insulating pattern 276 surrounding at least a portion of the first connection electrode 730 may be in the first circuit area 80 on the first interlayer insulating layer 190. For example, the first insulating pattern 276 may cover both sides of the first connection electrode 730 in the first circuit area 80. The first insulating pattern 276 may include an organic insulating material. For example, the first insulating pattern 276 may include a photoresist, a polyacryl-based resin, a polyimide-based resin, a polyamide-based resin, a siloxane-based resin, an acryl-based resin, an epoxy-based resin, and/or the like.

The second insulating pattern 277 surrounding at least a portion of the second connection electrode 740 may be in the first circuit area 80 on the first interlayer insulating layer 190. For example, the second insulating pattern 277 may cover both sides of the second connection electrode 740 in the first circuit area 80. The second insulating pattern 277 may include an organic insulating material.

In exemplary embodiments, the second planarization layer 275, the first insulating pattern 276, and the second insulating pattern 277 may include the same (e.g., substantially the same) material, and may be concurrently (e.g., simultaneously) formed in the same process by using a halftone mask.

The display device 900 according to exemplary embodiments of the present disclosure includes the first insulating pattern 276 and the second insulating pattern 277, so that the etchant used to form the lower electrode 290 may not make contact (e.g., physical contact) with the both sides of each of the first and second connection electrodes 730 and 740 in the process of forming the lower electrode 290. For example, because the both sides of each of the first and second connection electrodes 730 and 740 may be etched to the relatively greater extent by the etchant, which causes the undercut phenomenon, the both sides of each of the first and second connection electrodes 730 and 740 may be covered with the first and second insulating patterns 276 and 277, so that the undercut phenomenon may be prevented or reduced.

Figure 9:
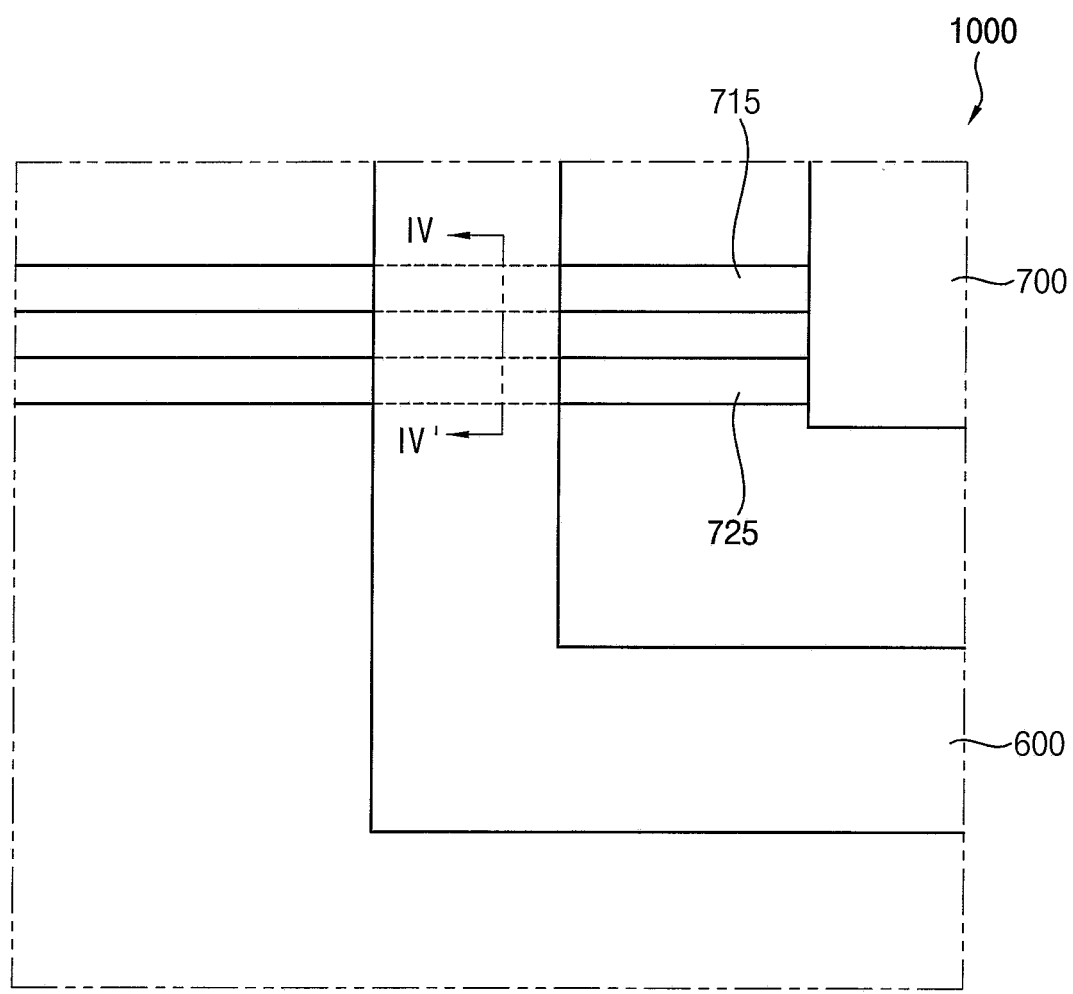
FIG. 9 is a partially enlarged plan view showing a display device according to exemplary embodiments of the present disclosure.
Figure 9:
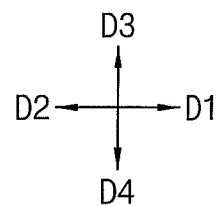
Figure 10:
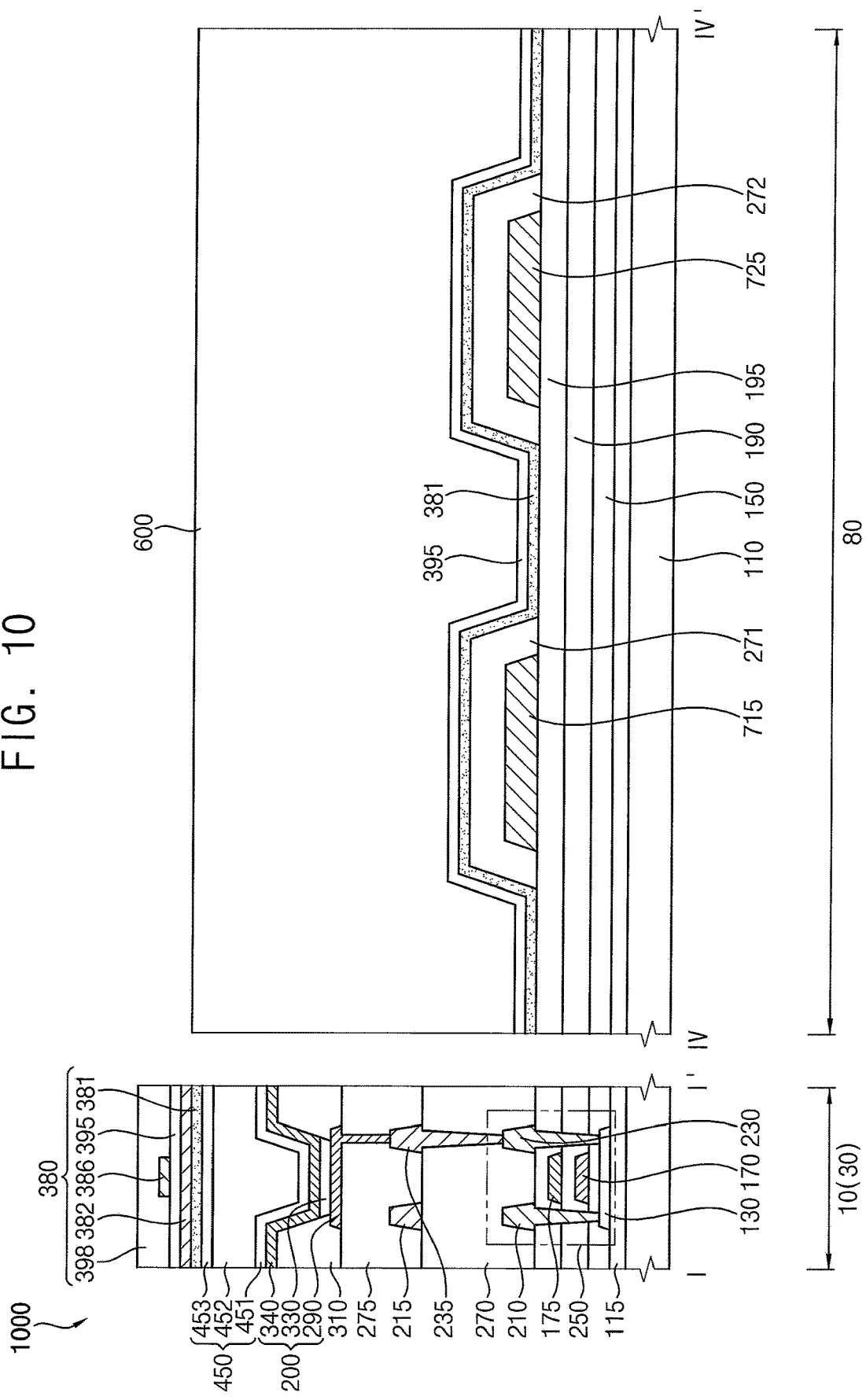
FIG. 10 is a cross-sectional view taken along line I-I' of FIG. 1 and line IV-IV' of FIG. 9.

FIG. 9 is a partially enlarged plan view showing a display device according to exemplary embodiments of the present disclosure, and FIG. 10 is a cross-sectional view taken along line I-I' of FIG. 1 and line IV-IV' of FIG. 9. A display device 1000 illustrated in FIGS. 9 and 10 may have a configuration which is substantially identical or similar to the configuration of the display device 100 described with reference to FIGS. 1 to 4 except for a first insulating pattern 271 and a second insulating pattern 272. In FIGS. 9 and 10, redundant descriptions of components which are substantially identical or similar to the components described with reference to FIGS. 1 to 4 will not be repeated here.

Referring to FIGS. 9 and 10, the display device 1000 may include a substrate 110, a buffer layer 115, a semiconductor element 250, a first lighting wire 715, a second lighting wire 725, a first planarization layer 270, a wire pattern 215, a connection pattern 235, a second planarization layer 275, a first insulating pattern 271, a second insulating pattern 272, a pixel structure 200, a pixel defining layer 310, a thin film encapsulation structure 450, a sensing structure 380, a driving integrated circuit part 600, a lighting circuit part 700, pad electrodes 470, and/or the like. In some embodiments, the semiconductor element 250 may include an active layer 130, a gate insulating layer 150, a first gate electrode 170, a first interlayer insulating layer 190, a second gate electrode 175, a second interlayer insulating layer 195, a source electrode 210, and a drain electrode 230. In some embodiments, the display device 1000 may include a display area 10 and a pad area 60. In some embodiments, the display area 10 may include pixel areas 30, and the pad area 60 may include a first circuit area 80, a second circuit area 70, and a lighting wire area 90.

The first lighting wire 715 may be in the pad area 60 on the second interlayer insulating layer 195. In exemplary embodiments, the first lighting wire 715 may overlap the lighting wire area 90 and the first circuit area 80. A first end of the first lighting wire 715 may be coupled to the lighting circuit part 700, and a second end opposite to the first end of the first lighting wire 715 may be coupled to one of the pad electrodes 470.

The second lighting wire 725 may be in the pad area 60 on the second interlayer insulating layer 195 while being spaced apart from the first lighting wire 715. In exemplary embodiments, the second lighting wire 725 may overlap the lighting wire area 90 and the first circuit area 80. A first end of the second lighting wire 725 may be coupled to the lighting circuit part 700, and a second end opposite to the first end of the second lighting wire 725 may be coupled to another one of the pad electrodes 470.

Each of the first and second lighting wires 715 and 725 may include a metal, an alloy, a metal nitride, a conductive metal oxide, a transparent conductive material, and/or the like. The foregoing may be used alone or in combination with each other.

In exemplary embodiments, the source electrode 210, the drain electrode 230, and the first and second lighting wires 715 and 725 may be located on the same layer, and may include the same (e.g., substantially the same) material.

The first insulating pattern 271 which covers the first lighting wire 715 may be in the first circuit area 80 on the first interlayer insulating layer 190. For example, the first insulating pattern 271 may completely cover the first lighting wire 715 in the first circuit area 80. The first insulating pattern 271 may include an organic insulating material. For example, the first insulating pattern 271 may include a photoresist, a polyacryl-based resin, a polyimide-based resin, a polyamide-based resin, a siloxane-based resin, an acryl-based resin, an epoxy-based resin, and/or the like.

The second insulating pattern 272 which covers the second lighting wire 725 may be in the first circuit area 80 on the first interlayer insulating layer 190. For example, the second insulating pattern 272 may completely cover the second lighting wire 725 in the first circuit area 80. The second insulating pattern 272 may include an organic insulating material.

In exemplary embodiments, the first planarization layer 270, the first insulating pattern 271, and the second insulating pattern 272 may include the same (e.g., substantially the same) material, and may be concurrently (e.g., simultaneously) formed in the same process by using a halftone mask.

The display device 1000 according to exemplary embodiments of the present disclosure includes the first insulating pattern 271 and the second insulating pattern 272, so that the etchant used to form the lower electrode 290 may not make contact (e.g., physical contact) with the first and second lighting wires 715 and 725 in the process of forming the lower electrode 290.

In addition, the lighting wires which couple the pad electrodes 470 to the lighting circuit part 700 are integrally formed, so that a wire resistance may be relatively reduced.

FIGS. 11 to 23 are views showing a method of manufacturing a display device according to exemplary embodiments of the present disclosure.

Figure 11:
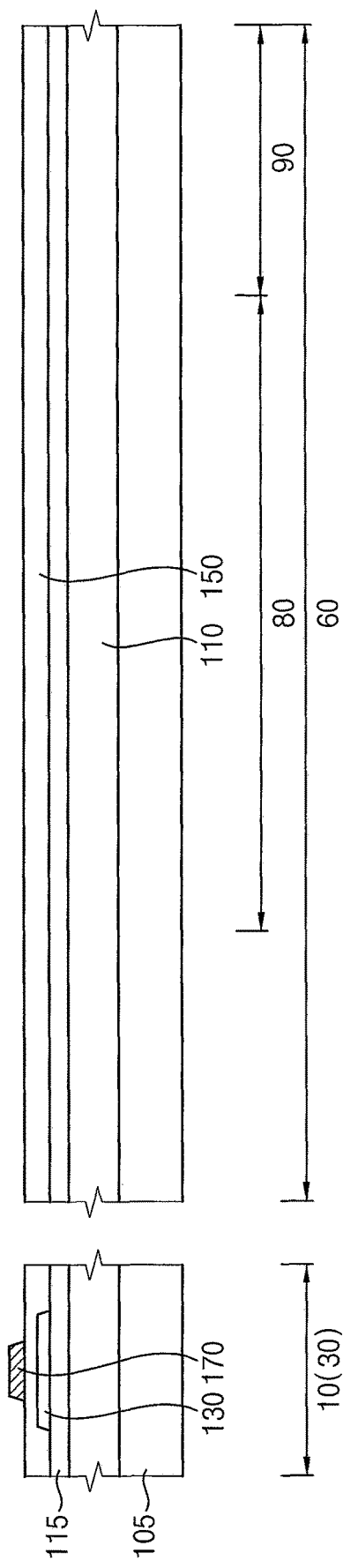
FIGS. 11 to 23 are views showing a method of manufacturing a display device according to exemplary embodiments of the present disclosure.

Referring to FIGS. 11 and 12, a rigid glass substrate 105 may be provided. The substrate 110 including transparent or opaque materials may be formed on the glass substrate 105. The substrate 110 may be a transparent resin substrate having flexibility. In exemplary embodiments, the substrate 110 may have a configuration in which a first organic layer, a first barrier layer, a second organic layer, and a second barrier layer are sequentially stacked. The first barrier layer and the second barrier layer may be formed by using an inorganic material such as silicon oxide. In some embodiments, the first organic layer and the second organic layer may be formed by using an organic insulating material such as a polyimide-based resin. In some embodiments, each of the first and second barrier layers may block or reduce penetration of moisture through the first and second organic layers.

As shown in FIGS. 1 and 12, the substrate 110 may include the display area 10 including the pixel area 30, and the pad area 60 including the first circuit area 80, the lighting wire area 90, and the second circuit area 70.

The buffer layer 115 may be formed on the substrate 110. For example, the buffer layer 115 may be formed over the whole of the display area 10 and the pad area 60 on the substrate 110. The buffer layer 115 may be formed by using a silicon compound, metal oxide, and/or the like.

The active layer 130 may be formed in the display area 10 on the buffer layer 115. The active layer 130 may be formed by using a metal oxide semiconductor, an inorganic semiconductor, an organic semiconductor, and/or the like. The active layer 130 may have a source region, a drain region, and a channel region located between the source region and the drain region.

The gate insulating layer 150 may be formed on the active layer 130. The gate insulating layer 150 may cover the active layer 130 in the display area 10 on the buffer layer 115, and may extend in the fourth direction D4. For example, in some embodiments, the gate insulating layer 150 may be formed over the whole of the display area 10 and the pad area 60 on the buffer layer 115. For example, the gate insulating layer 150 may suitably or sufficiently cover the active layer 130 on the buffer layer 115, and may have a substantially flat top surface without (or substantially without) creating a step around the active layer 130. In some embodiments, the gate insulating layer 150 may be formed along a profile of the active layer 130 with a uniform (e.g., substantially uniform) thickness to cover the active layer 130 on the buffer layer 115. The gate insulating layer 150 may be formed by using a silicon compound, metal oxide, and/or the like.

The first gate electrode 170 may be formed in the display area 10 on the gate insulating layer 150. The first gate electrode 170 may be formed at a portion of the gate insulating layer 150 under which the active layer 130 is located. The first gate electrode 170 may be formed by using a metal, an alloy, a metal nitride, a conductive metal oxide, a transparent conductive material, and/or the like. The foregoing may be used alone or in combination with each other.

Figure 13:
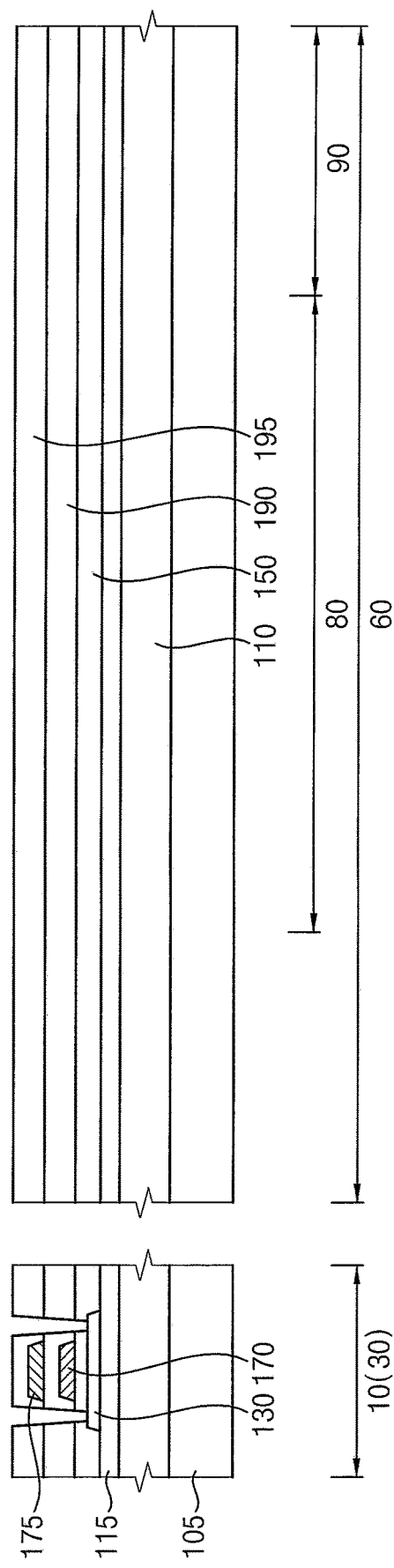

Referring to FIG. 13, the first interlayer insulating layer 190 may be formed on the first gate electrode 170. The first interlayer insulating layer 190 may cover the first gate electrode 170 in the display area 10 on the gate insulating layer 150, and may extend in the fourth direction D4. For example, in some embodiments, the first interlayer insulating layer 190 may be formed over the whole of the display area 10 and the pad area 60 on the gate insulating layer 150. For example, the first interlayer insulating layer 190 may suitably or sufficiently cover the first gate electrode 170 on the gate insulating layer 150, and may have a substantially flat top surface without (or substantially without) creating a step around the first gate electrode 170. In some embodiments, the first interlayer insulating layer 190 may be formed along a profile of the first gate electrode 170 with a uniform (e.g., substantially uniform) thickness to cover the first gate electrode 170 on the gate insulating layer 150. The first interlayer insulating layer 190 may be formed by using a silicon compound, metal oxide, and/or the like.

The second gate electrode 175 may be formed in the display area 10 on the first interlayer insulating layer 190. The second gate electrode 175 may be formed at a portion of the first interlayer insulating layer 190 under which the first gate electrode 170 is located. The second gate electrode 175 may be formed by using a metal, an alloy, a metal nitride, a conductive metal oxide, a transparent conductive material, and/or the like. The foregoing may be used alone or in combination with each other.

The second interlayer insulating layer 195 may be formed on the second gate electrode 175. The second interlayer insulating layer 195 may cover the second gate electrode 175 in the display area 10 on the first interlayer insulating layer 190, and may extend in the fourth direction D4. For example, in some embodiments, the second interlayer insulating layer 195 may be formed over the whole of the display area 10 and the pad area 60 on the first interlayer insulating layer 190. For example, the second interlayer insulating layer 195 may suitably or sufficiently cover the second gate electrode 175 on the first interlayer insulating layer 190, and may have a substantially flat top surface without (or substantially without) creating a step around the second gate electrode 175. In some embodiments, the second interlayer insulating layer 195 may be formed along a profile of the second gate electrode 175 with a uniform (e.g., substantially uniform) thickness to cover the second gate electrode 175 on the first interlayer insulating layer 190. The second interlayer insulating layer 195 may be formed by using a silicon compound, metal oxide, and/or the like.

After the second interlayer insulating layer 195 is formed, contact holes which expose the source and drain regions of the active layer 130 may be formed by removing first and second portions of the gate insulating layer 150, the first interlayer insulating layer 190, and the second interlayer insulating layer 195.

Figure 14:
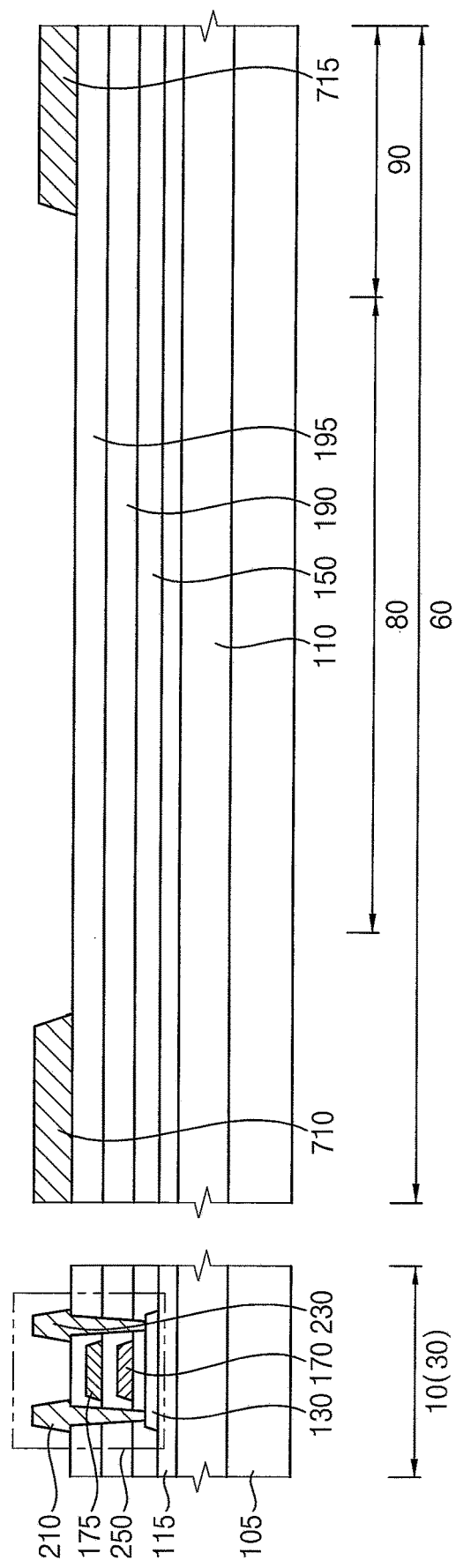
Figure 15:
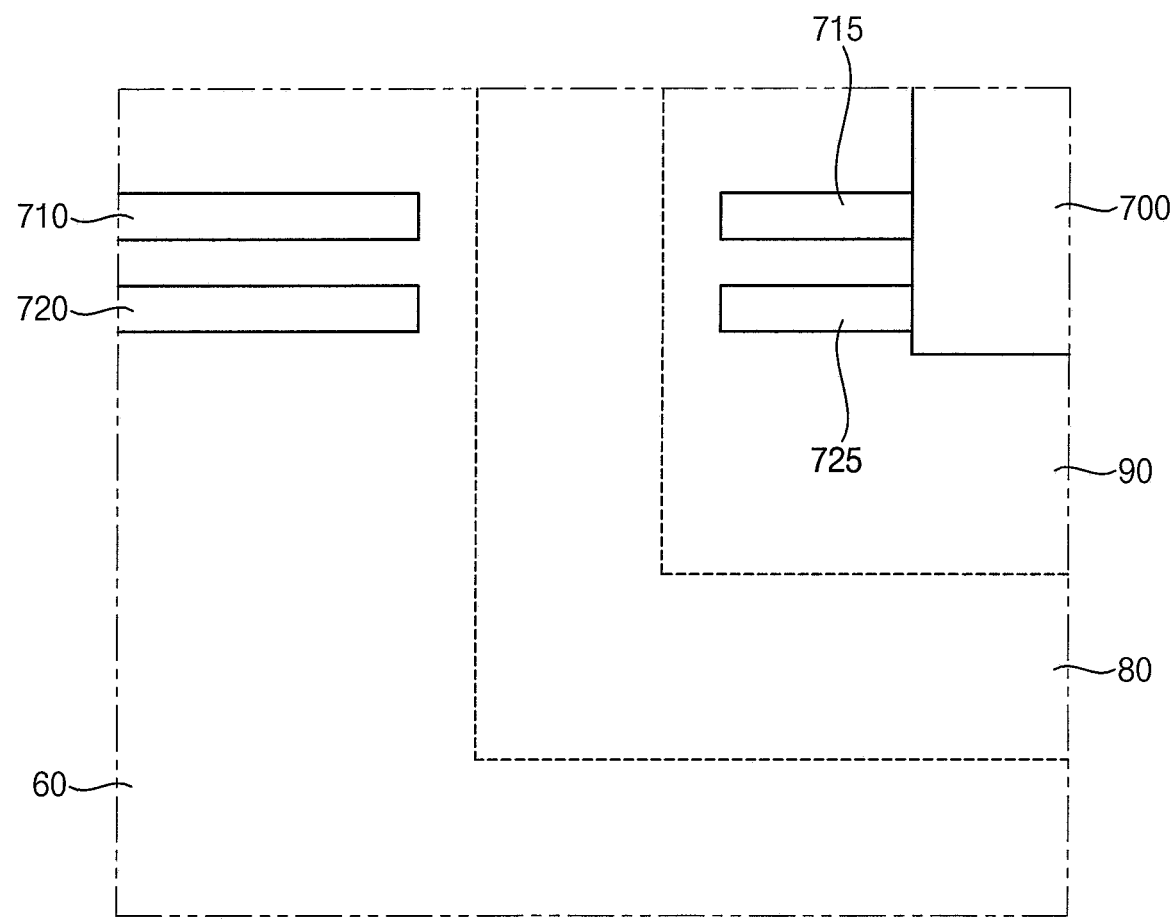
Figure 15:
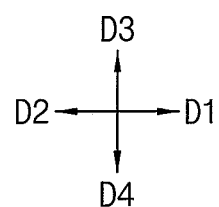

Referring to FIGS. 14 and 15, the source electrode 210 and the drain electrode 230 may be formed in the display area 10 on the second interlayer insulating layer 195. The source electrode 210 may be coupled to the source region of the active layer 130 by passing through the contact hole formed by removing the first portions of the gate insulating layer 150, the first interlayer insulating layer 190, and the second interlayer insulating layer 195, and the drain electrode 230 may be coupled to the drain region of the active layer 130 by passing through the contact hole formed by removing the second portions of the gate insulating layer 150, the first interlayer insulating layer 190, and the second interlayer insulating layer 195. Each of the source electrode 210 and the drain electrode 230 may be formed by using a metal, an alloy, a metal nitride, a conductive metal oxide, a transparent conductive material, and/or the like. The foregoing may be used alone or in combination with each other.

Accordingly, the semiconductor element 250 including the active layer 130, the gate insulating layer 150, the first gate electrode 170, the first interlayer insulating layer 190, the second gate electrode 175, the second interlayer insulating layer 195, the source electrode 210, and the drain electrode 230 may be formed.

In the process of forming the semiconductor element 250, lighting semiconductor elements may be concurrently (e.g., simultaneously) formed in the second circuit area 70. Accordingly, the lighting circuit part 700 may be formed in the second circuit area 70.

The first lighting wire 715 and the third lighting wire 725 may be formed in the lighting wire area 90 on the second interlayer insulating layer 195 while being spaced apart from each other. Each of the first lighting wire 715 and the third lighting wire 725 may extend in the first direction D1 in the lighting wire area 90 on the second interlayer insulating layer 195 so as to be coupled to the lighting circuit part 700. Each of the first lighting wire 715 and the third lighting wire 725 may be formed by using a metal, an alloy, a metal nitride, a conductive metal oxide, a transparent conductive material, and/or the like. The foregoing may be used alone or in combination with each other.

The second lighting wire 710 and the fourth lighting wire 720 may be formed in the pad area 60 on the second interlayer insulating layer 195 while being spaced apart from each other. Each of the second lighting wire 710 and the fourth lighting wire 720 may extend in the second direction D2 and the fourth direction D4 so as to be coupled to the pad electrode 470. Each of the second lighting wire 710 and the fourth lighting wire 720 may be formed by using a metal, an alloy, a metal nitride, a conductive metal oxide, a transparent conductive material, and/or the like. The foregoing may be used alone or in combination with each other.

In exemplary embodiments, the source electrode 210, the drain electrode 230, the first lighting wire 715, the second lighting wire 710, the third lighting wire 725, and the fourth lighting wire 720 may be concurrently (e.g., simultaneously) formed on the same layer by using the same (e.g., substantially the same) material. For example, the source electrode 210, the drain electrode 230, the first lighting wire 715, the second lighting wire 710, the third lighting wire 725, and the fourth lighting wire 720 may be concurrently (e.g., simultaneously) formed by forming a first preliminary electrode layer over the whole second interlayer insulating layer 195 and partially etching the first preliminary electrode layer.

Each of the source electrode 210, the drain electrode 230, the first lighting wire 715, the second lighting wire 710, the third lighting wire 725, and the fourth lighting wire 720 may include Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, and/or the like.

Figure 16:
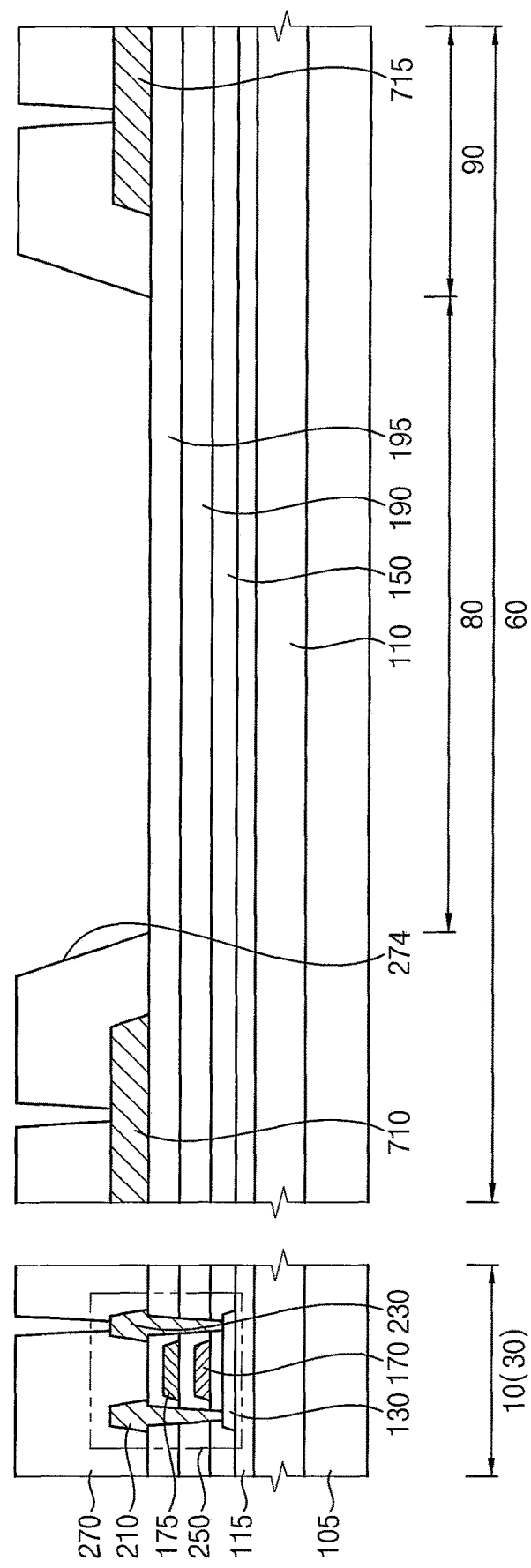

Referring to FIG. 16, the first planarization layer 270 may be formed on the second interlayer insulating layer 195, the source and drain electrodes 210 and 230, and the first to fourth lighting wires 715, 710, 725, and 720. The first planarization layer 270 may be formed in the display area 10 and a portion of the pad area 60 on the second interlayer insulating layer 195. For example, in some embodiments, the first planarization layer 270 may extend in the fourth direction D4 to cover the source and drain electrodes 210 and 230 in the display area 10 on the second interlayer insulating layer 195, and may cover the first to fourth lighting wires 715, 710, 725, and 720 in the pad area 60. In some embodiments, the first planarization layer 270 may have a first opening 274 which exposes a top surface of the second interlayer insulating layer 195 located in the first circuit area 80. In some embodiments, a contact hole which exposes a portion of the drain electrode 230, a contact hole which exposes a portion of the first lighting wire 715, a contact hole which exposes a portion of the second lighting wire 710, a contact hole which exposes a portion of the third lighting wire 725, and a contact hole which exposes a portion of the fourth lighting wire 720 may be concurrently (e.g., simultaneously) formed in a process of forming the first opening 274.

The first planarization layer 270 may have a relatively thick thickness. In this case, the first planarization layer 270 may have a substantially flat top surface. In order to implement such a flat top surface of the first planarization layer 270, a planarization process may be additionally performed on the first planarization layer 270. The first planarization layer 270 may be formed by using an organic insulating material. For example, the first planarization layer 270 may include a photoresist, a polyacryl-based resin, a polyimide-based resin, a polyamide-based resin, a siloxane-based resin, an acryl-based resin, an epoxy-based resin, and/or the like.

Figure 17:
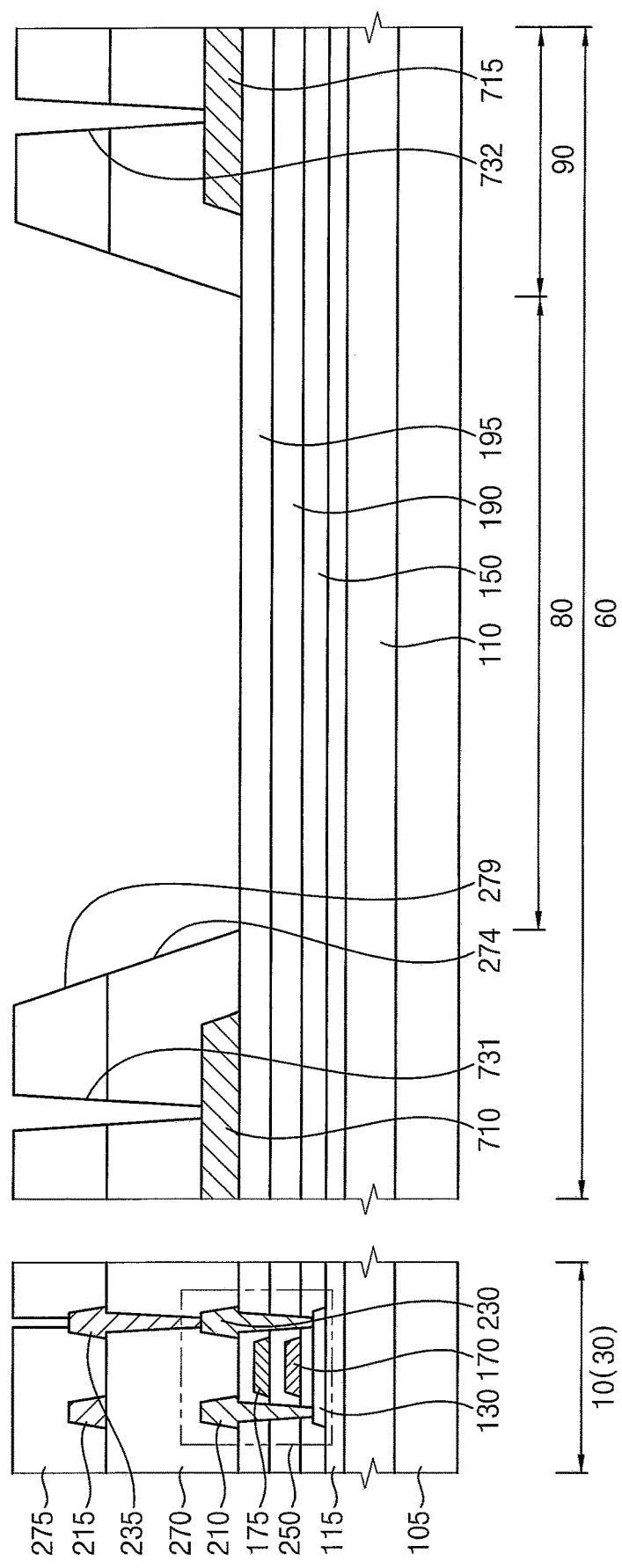

Referring to FIG. 17, the wire pattern 215 and the connection pattern 235 may be formed in the display area 10 on the first planarization layer 270 while being spaced apart from each other. The connection pattern 235 may be coupled to the drain electrode 230 by passing through the contact hole formed by removing a portion of the first planarization layer 270 located in the display area 10. Each of the wire pattern 215 and the connection pattern 235 may be formed by using a metal, an alloy, a metal nitride, a conductive metal oxide, a transparent conductive material, and/or the like. The foregoing may be used alone or in combination with each other.

The second planarization layer 275 may be formed on the wire pattern 215, the connection pattern 235, and the first planarization layer 270. The second planarization layer 275 may be in the display area 10 and a portion of the pad area 60 on the first planarization layer 270. For example, in some embodiments, the second planarization layer 275 may extend in the fourth direction D4 to cover the wire pattern 215 and the connection pattern 235 in the display area 10 on the first planarization layer 270, and may be formed on the first planarization layer 270 in the pad area 60. In some embodiments, the second planarization layer 275 may have a second opening 279 which exposes the top surface of the second interlayer insulating layer 195 located in the first circuit area 80. some embodiments, a contact hole which exposes a portion of the connection pattern 235, a contact hole overlapping the contact hole of the first planarization layer 270 which exposes the portion of the first lighting wire 715, a contact hole overlapping the contact hole of the first planarization layer 270 which exposes the portion of the second lighting wire 710, a contact hole overlapping the contact hole of the first planarization layer 270 which exposes the portion of the third lighting wire 725, and a contact hole overlapping the contact hole of the first planarization layer 270 which exposes the portion of the fourth lighting wire 720 may be concurrently (e.g., simultaneously) formed in a process of forming the second opening 279.

Figure 20:
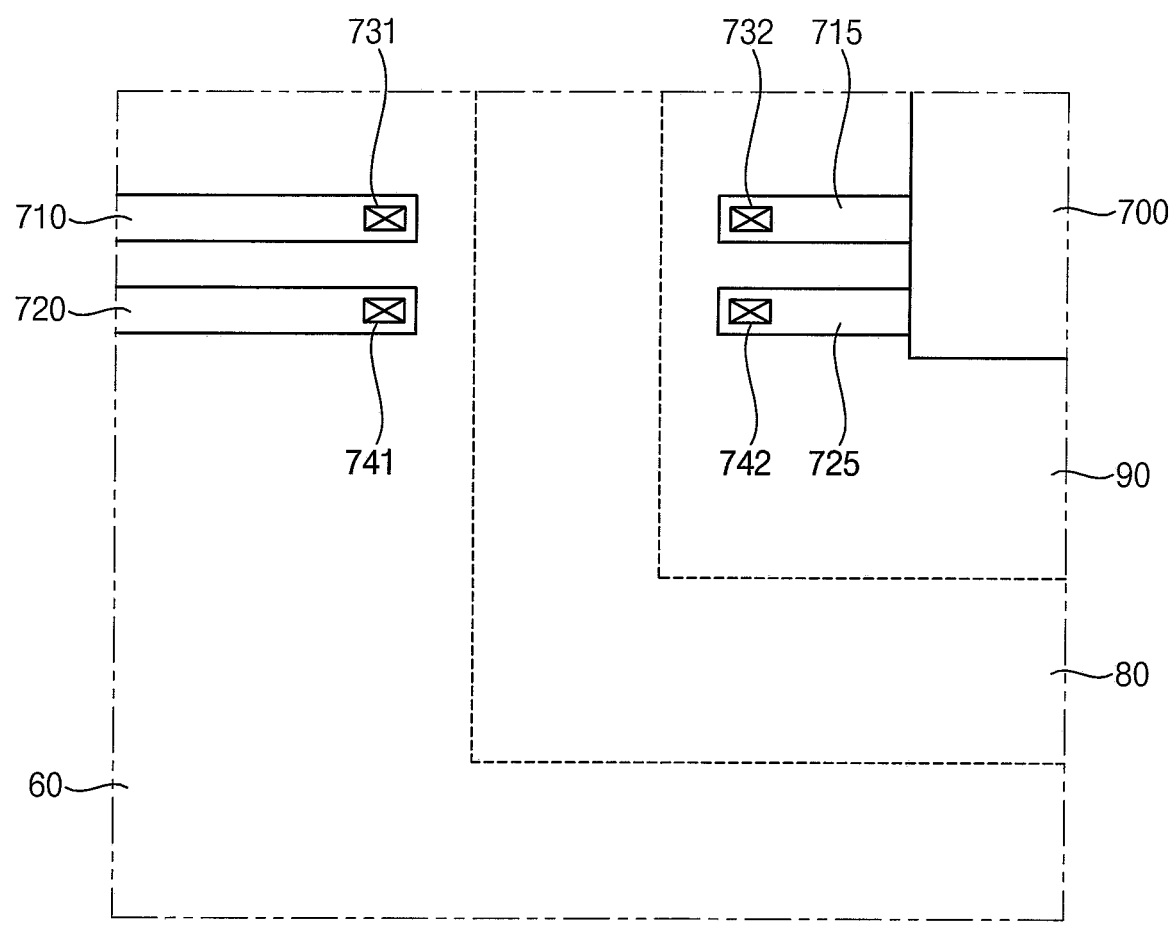
Figure 20:
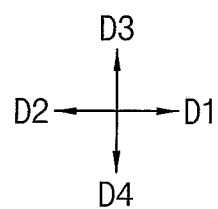

In some embodiments, the contact hole of the first planarization layer 270 which exposes the portion of the first lighting wire 715 and the contact hole of the second planarization layer 275 overlapping the contact hole may be defined as the first contact hole 732, the contact hole of the first planarization layer 270 which exposes the portion of the second lighting wire 710 and the contact hole of the second planarization layer 275 overlapping the contact hole may be defined as the second contact hole 731, the contact hole of the first planarization layer 270 which exposes the portion of the third lighting wire 725 and the contact hole of the second planarization layer 275 overlapping the contact hole may be defined as the third contact hole 742, and the contact hole of the first planarization layer 270 which exposes the portion of the fourth lighting wire 720 and the contact hole of the second planarization layer 275 overlapping the contact hole may be defined as the fourth contact hole 741 (see FIG. 20).

The second planarization layer 275 may have a relatively thick thickness. In this case, the second planarization layer 275 may have a substantially flat top surface. In order to implement such a flat top surface of the second planarization layer 275, a planarization process may be additionally performed on the second planarization layer 275. The second planarization layer 275 may be formed by using an organic insulating material.

Figure 18:
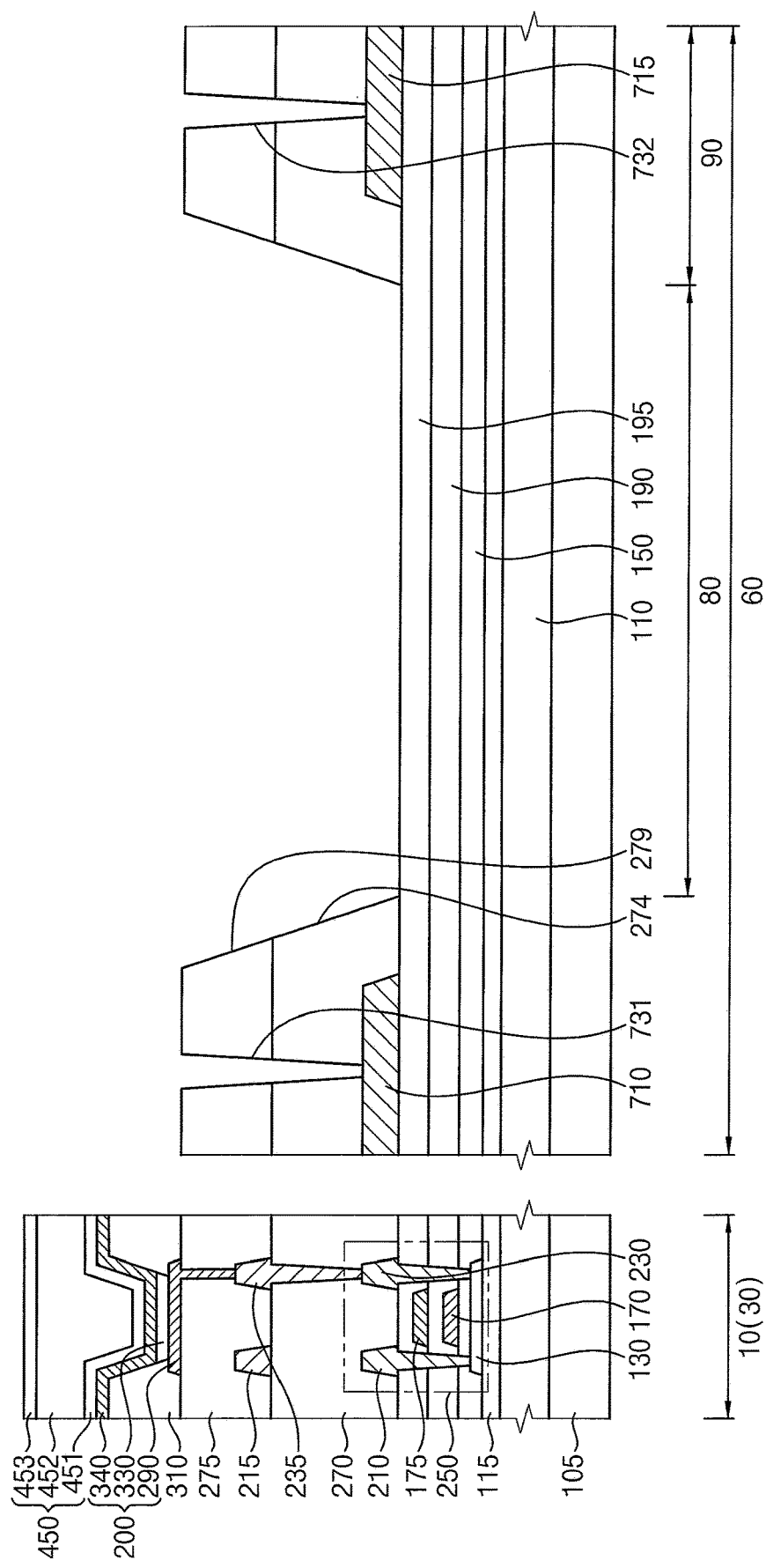

Referring to FIG. 18, the lower electrode 290 may be formed in the display area 10 on the second planarization layer 275. The lower electrode 290 may be coupled to the connection pattern 235 by passing through the contact hole formed by removing a portion of the second planarization layer 275. The lower electrode 290 may be formed by using a metal, an alloy, a metal nitride, a conductive metal oxide, a transparent conductive material, and/or the like. The foregoing may be used alone or in combination with each other.

The pixel defining layer 310 may be formed in the display area 10 on the second planarization layer 275. For example, in some embodiments, the pixel defining layer 310 may not be formed in the pad area 60. The pixel defining layer 310 may expose a portion of the lower electrode 290 in the display area 10. The pixel defining layer 310 may be formed by using an organic insulating material.

The organic light emitting layer 330 may be formed on the lower electrode 290. The organic light emitting layer 330 may be formed by using at least one of light emitting materials for emitting different color lights according to pixels. In some embodiments, the organic light emitting layer 330 may be formed by stacking a plurality of light emitting materials for generating different color lights such as red light, green light, and blue light to emit white light as a whole.

The upper electrode 340 may be formed over the whole display area 10 on the substrate 110. The upper electrode 340 may be formed along a profile of the organic light emitting layer 330 and the pixel defining layer 310. The upper electrode 340 may be formed by using a metal, an alloy, a metal nitride, a conductive metal oxide, a transparent conductive material, and/or the like. The foregoing may be used alone or in combination with each other.

Accordingly, the pixel structure 200 including the lower electrode 290, the organic light emitting layer 330, and the upper electrode 340 may be formed.

The first inorganic thin film encapsulation layer 451 may be formed in the display area 10 on the upper electrode 340. For example, the first inorganic thin film encapsulation layer 451 may be formed along a profile of the upper electrode 340 in the display area 10. The first inorganic thin film encapsulation layer 451 may be formed by using an inorganic insulating material having flexibility.

The organic thin film encapsulation layer 452 may be formed in the display area 10 on the first inorganic thin film encapsulation layer 451. The organic thin film encapsulation layer 452 may be formed by using an organic insulating material having flexibility.

The second inorganic thin film encapsulation layer 453 may be formed on the organic thin film encapsulation layer 452. The second inorganic thin film encapsulation layer 453 may be formed along a profile of the organic thin film encapsulation layer 452 with a uniform (e.g., substantially uniform) thickness to cover the organic thin film encapsulation layer 452 in the display area 10. The second inorganic thin film encapsulation layer 453 may be formed by using an inorganic insulating material having flexibility.

Accordingly, the thin film encapsulation structure 450 including the first inorganic thin film encapsulation layer 451, the organic thin film encapsulation layer 452, and the second inorganic thin film encapsulation layer 453 may be formed.

Figure 19:
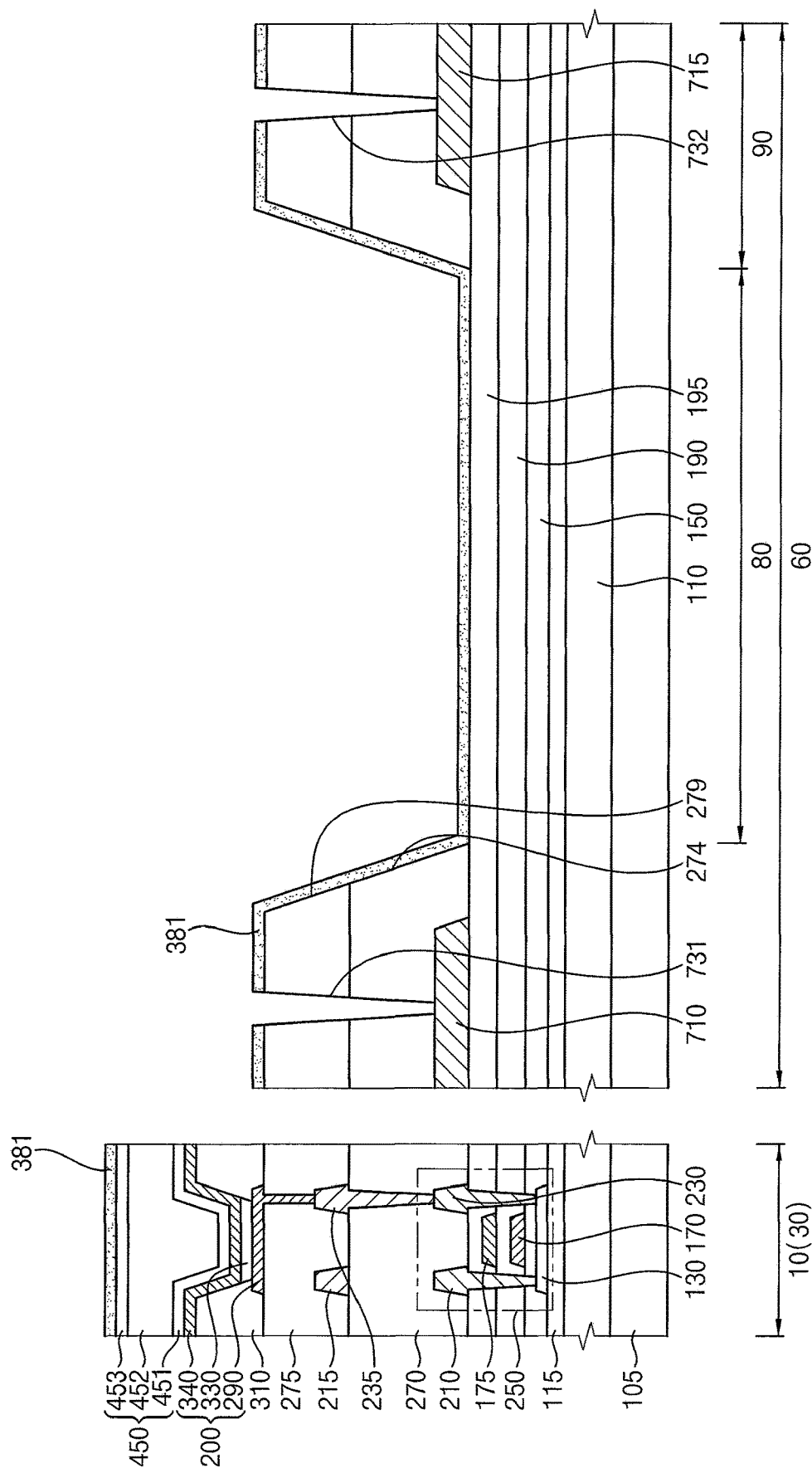

Referring to FIGS. 19 and 20, the insulating layer 381 may be formed on the second inorganic thin film encapsulation layer 453, the second planarization layer 275, the first planarization layer 270, and the second interlayer insulating layer 195. The insulating layer 381 may be formed on the second inorganic thin film encapsulation layer 453 in the display area 10, and may extend in the fourth direction D4 so as to be formed along a profile of the second planarization layer 275, the first planarization layer 270, and the second interlayer insulating layer 195 in the pad area 60. In some embodiments, the insulating layer 381 may be formed over the whole of the display area 10 and the pad area 60 on the substrate 110. For example, the insulating layer 381 may be formed along a profile of the second inorganic thin film encapsulation layer 453, the second planarization layer 275, the first planarization layer 270, and the second interlayer insulating layer 195 with a uniform (e.g., substantially uniform) thickness on the second inorganic thin film encapsulation layer 453, the second planarization layer 275, the first planarization layer 270, and the second interlayer insulating layer 195. The insulating layer 381 may have an opening which exposes the first contact hole 732, an opening which exposes the second contact hole 731, an opening which exposes the third contact hole 742, and an opening which exposes the fourth contact hole 741. The insulating layer 381 may be formed by using a silicon compound, metal oxide, and/or the like.

Figure 21:
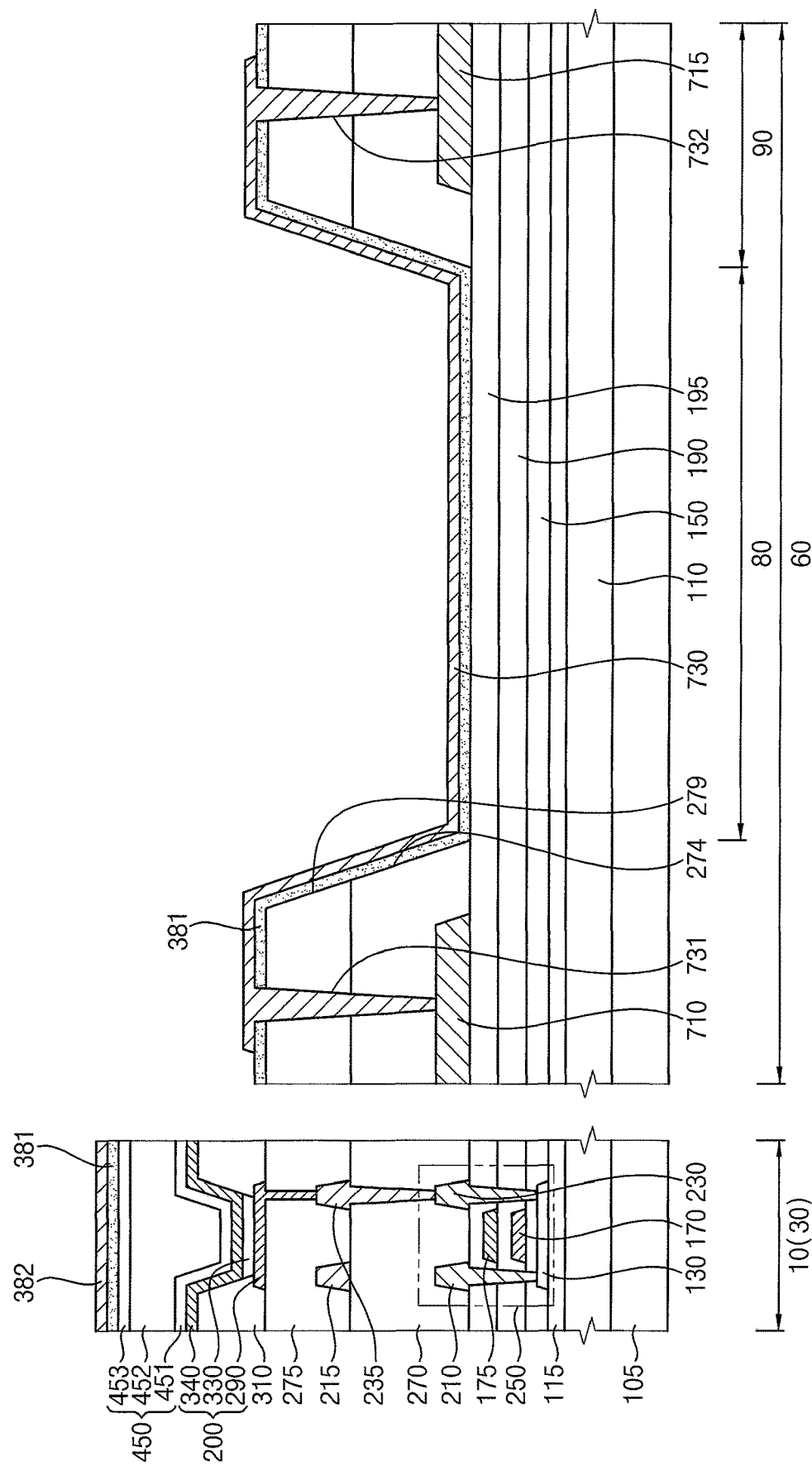

Referring to FIGS. 2, 4, and 21, the first and second sensing electrodes 382 and 384 may be formed in the display area 10 on the insulating layer 381. Each of the first sensing electrodes 382 may extend in the third direction D3, and the first sensing electrodes 382 may be spaced apart from each other in the first direction D1. The second sensing electrodes 384 may be formed between two adjacent first sensing electrodes 382 among the first sensing electrodes 382 while being spaced apart from each other in the third direction D3. For example, each of the first and second sensing electrodes 382 and 384 may be formed by using CNT, a transparent conductive oxide such as $ZnO_x$, ITO, $SnO_x$, $InO_x$, $GaO_x$, IZO, and/or IGZO, graphene, AgNW, Cu, Cr, and/or the like.

The first and second connection electrodes 730 and 740 may be formed on the second planarization layer 275, the first planarization layer 270, and the second interlayer insulating layer 195 located in the pad area 60 while being spaced apart from each other. Each of the first and second connection electrodes 730 and 740 may be formed along a profile of the second planarization layer 275, the first planarization layer 270, and the second interlayer insulating layer 195 in the pad area 60, and may be formed between the driving integrated circuit part 600 and the insulating layer 381 in the first circuit area 80. The first connection electrode 730 may be coupled to the first lighting wire 715 and the second lighting wire 710 through the first contact hole 732 and the second contact hole 731 formed in the first and second planarization layers 270 and 275, respectively. In addition, the second connection electrode 740 may be coupled to the third lighting wire 725 and the fourth lighting wire 720 through the third contact hole 742 and the fourth contact hole 741 formed in the first and second planarization layers 270 and 275, respectively.

Each of the first and second connection electrodes 730 and 740 may include a metal, an alloy, a metal nitride, a conductive metal oxide, a transparent conductive material, and/or the like. The foregoing may be used alone or in combination with each other.

In exemplary embodiments, the first and second sensing electrodes 382 and 384 and the first and second connection electrodes 730 and 740 may be concurrently (e.g., simultaneously) formed by using the same (e.g., substantially the same) material. For example, the first and second sensing electrodes 382 and 384 and the first and second connection electrodes 730 and 740 may be concurrently (e.g., simultaneously) formed by forming a second preliminary electrode layer over the whole insulating layer 381 and partially etching the second preliminary electrode layer.

Figure 22:
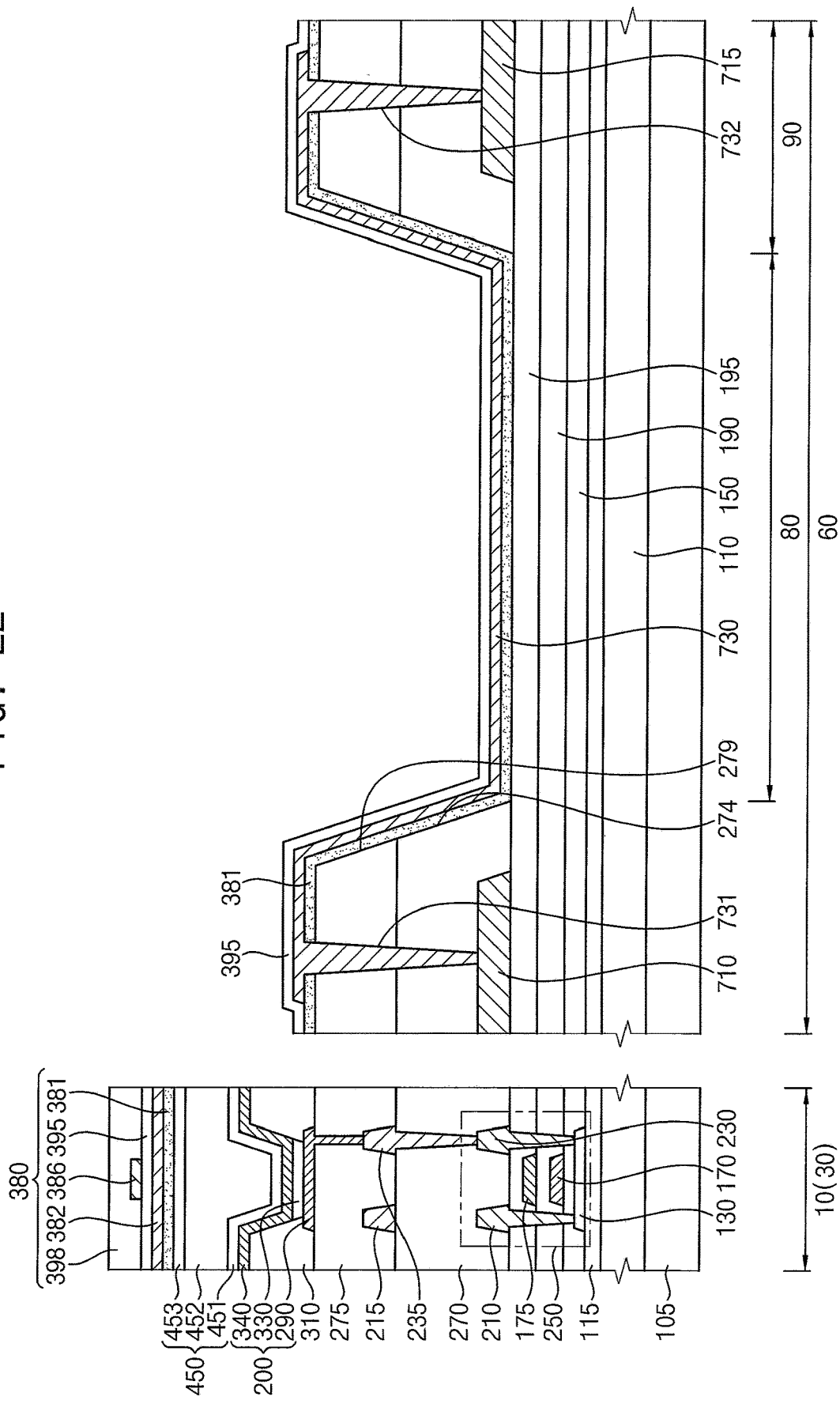

Referring to FIG. 22, the first insulating layer 395 may be formed on the insulating layer 381, the first sensing electrode 382, the second sensing electrode 384, the first connection electrode 730, and the second connection electrode 740. The first insulating layer 395 may cover the first sensing electrode 382 and the second sensing electrode 384 in the display area 10 on the insulating layer 381, and may extend in the fourth direction D4 to cover the first connection electrode 730 and the second connection electrode 740 in the pad area 60 on the insulating layer 381. In some embodiments, the first insulating layer 395 may be formed over the whole of the display area 10 and the pad area 60 on the insulating layer 381. For example, the first insulating layer 395 may be formed along a profile of the first and second sensing electrodes 382 and 384 and the first and second connection electrodes 730 and 740 with a uniform (e.g., substantially uniform) thickness to cover the first and second sensing electrodes 382 and 384 and the first and second connection electrodes 730 and 740 on the insulating layer 381. In some embodiments, the first insulating layer 395 may suitably or sufficiently cover the first and second sensing electrodes 382 and 384 and the first and second connection electrodes 730 and 740 on the insulating layer 381, and may have a substantially flat top surface without (or substantially without) creating a step around the first and second sensing electrodes 382 and 384 and the first and second connection electrodes 730 and 740. The first insulating layer 395 may be formed by using a silicon compound, a metal oxide, and/or the like. For example, the first insulating layer 395 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, and/or the like.

The sensing connection electrodes 386 may be formed in the display area 10 on the first insulating layer 395. Each of the sensing connection electrodes 386 may be coupled to two second sensing electrodes 384, which are adjacent to each other in the first direction D1 among the second sensing electrodes 384, by passing through contact holes formed by removing a portion of the first insulating layer 395. For example, the sensing connection electrodes 386 may be formed by using the same (e.g., substantially the same) material as the first and second sensing electrodes 382 and 384.

The second insulating layer 398 may be formed on the first insulating layer 395 and the sensing connection electrodes 386. The second insulating layer 398 may cover the sensing connection electrodes 386 in the display area 10 on the first insulating layer 395, and may not be formed in the pad area 60. The second insulating layer 398 may be formed by using an organic insulating material or an inorganic insulating material.

Accordingly, the sensing structure 380 including the insulating layer 381, the first sensing electrodes 382, the second sensing electrodes 384, the first insulating layer 395, the sensing connection electrodes 386, and the second insulating layer 398 may be formed.

Figure 23:
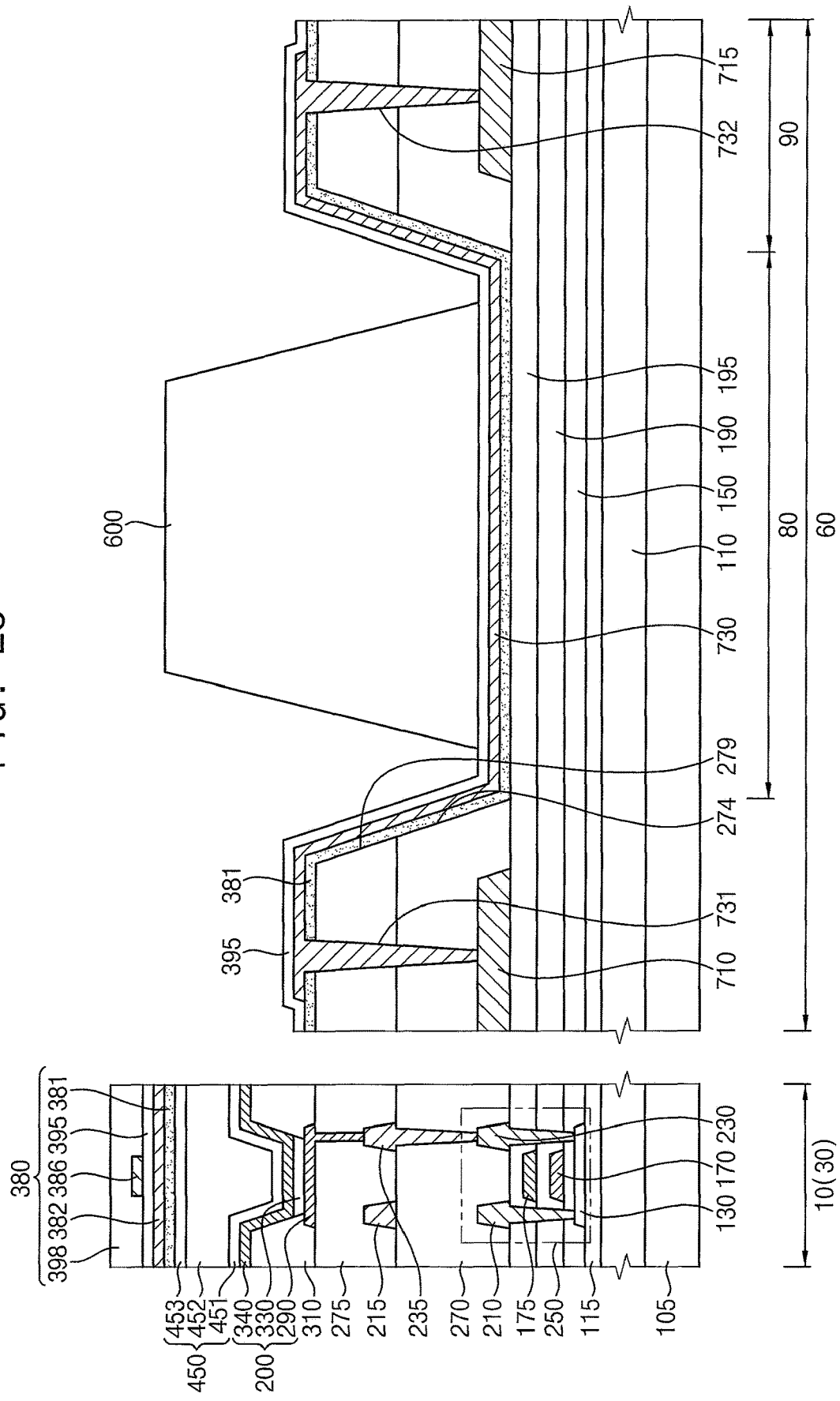

Referring to FIG. 23, the driving integrated circuit part 600 may be formed in the first circuit area 80 on the first insulating layer 395. In exemplary embodiments, the driving integrated circuit part 600 may be formed inside the first opening 274 and the second opening 279.

After the driving integrated circuit part 600 is formed, the glass substrate 105 may be removed from the substrate 110. Accordingly, the display device 100 shown in FIGS. 1 to 4 may be manufactured.

The subject matter of the present disclosure may be applied to various suitable electronic devices including a display device. For example, the subject matter of the present disclosure may be applied to vehicle-display device, a ship-display device, an aircraft-display device, portable communication devices, display devices for display or for information transfer, a medical-display device, etc.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the spirit and scope of the present disclosure. Accordingly, all such modifications are intended to be included within the scope of the present disclosure as defined in the claims, and equivalents thereof. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims, and equivalents thereof.

What is claimed is:

1. A display device comprising:
a substrate comprising a display area and a pad area;
a pixel structure on the substrate in the display area to emit light;
a lighting circuit part on the substrate in the pad area and electrically coupled to the pixel structure;
a driving integrated circuit part surrounding at least a portion of the lighting circuit part;
a first lighting wire spaced apart from a first side of the driving integrated circuit part in a first direction and coupled to the lighting circuit part;
a second lighting wire spaced apart from a second side facing the first side of the driving integrated circuit part in a second direction opposite to the first direction; and
a connection electrode to electrically couple the first lighting wire and the second lighting wire to each other.

2. The display device of claim 1, wherein each of the first lighting wire and the second lighting wire does not overlap the driving integrated circuit part.

3. The display device of claim 1, wherein the driving integrated circuit part has a rectangular shape having an opening when viewed in a plan view, and
the lighting circuit part is in the opening.

4. The display device of claim 1, wherein the driving integrated circuit part and the lighting circuit part are spaced apart from each other.

5. The display device of claim 1, wherein the substrate further comprises:
a first circuit area in which the driving integrated circuit part having an opening is located;
a second circuit area in which the lighting circuit part located inside the opening of the driving integrated circuit part is located; and
a lighting wire area interposed between the first circuit area and the second circuit area, in which the first lighting wire is in the lighting wire area.

6. The display device of claim 5, wherein the connection electrode is located between the substrate and the driving integrated circuit part in the first circuit area.

7. The display device of claim 1, further comprising a sensing structure on the pixel structure.

8. The display device of claim 7, wherein the sensing structure comprises:
a sensing electrode;
a first insulating layer on the sensing electrode; and a sensing connection electrode on the first insulating layer.

9. The display device of claim 8, wherein the sensing electrode and the connection electrode each comprise a same material.

10. The display device of claim 8, wherein the first insulating layer extends in a direction from the display area to the pad area to cover the sensing electrode in the display area, and covers the connection electrode in the pad area.

11. The display device of claim 8, wherein the first insulating layer directly contacts a bottom surface of the driving integrated circuit part and a top surface of the connection electrode in the pad area.

12. The display device of claim 1, further comprising a semiconductor element in the display area between the substrate and the pixel structure.

13. The display device of claim 12, wherein the semiconductor element comprises:
an active layer on the substrate;
a gate electrode on the active layer; and
source and drain electrodes on the gate electrode.

14. The display device of claim 13, wherein the first lighting wire and the second lighting wire are located on a same layer as the source and drain electrodes, and the first lighting wire and the second lighting wire each comprise a same material.

15. The display device of claim 13, wherein the connection electrode is located on a same layer as the gate electrode, and comprises a same material as the gate electrode.

16. The display device of claim 1, further comprising:
a first planarization layer between the substrate and the pixel structure; and
a second planarization layer on the first planarization layer.

17. The display device of claim 16, wherein the first planarization layer has a first opening formed in a portion of the pad area, and the second planarization layer has a second opening overlapping the first opening, and
wherein the driving integrated circuit part is inside the first and second openings.

18. The display device of claim 16, wherein a first contact hole passes through the first planarization layer and the second planarization layer and exposes a portion of the first lighting wire, and a second contact hole passes through the first planarization layer and the second planarization layer and exposes a portion of the second lighting wire in the pad area, and
the connection electrode is coupled to the first lighting wire and the second lighting wire through the first contact hole and the second contact hole, respectively.

19. The display device of claim 16, further comprising an insulating pattern surrounding at least a portion of the connection electrode.

20. The display device of claim 19, wherein the insulating pattern comprises a same material as the second planarization layer.

* * * * *